(12) United States Patent
Isobe et al.

(10) Patent No.: US 8,860,021 B2
(45) Date of Patent: Oct. 14, 2014

(54) SEMICONDUCTOR ELEMENT, METHOD FOR MANUFACTURING THE SEMICONDUCTOR ELEMENT, AND SEMICONDUCTOR DEVICE INCLUDING THE SEMICONDUCTOR ELEMENT

(71) Applicant: Semiconductor Energy Laboratory Co., Ltd., Atsugi (JP)

(72) Inventors: Atsuo Isobe, Isehara (JP); Hiromichi Godo, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 30 days.

(21) Appl. No.: 13/716,909

(22) Filed: Dec. 17, 2012

(65) Prior Publication Data
US 2013/0161606 A1 Jun. 27, 2013

(30) Foreign Application Priority Data

Dec. 23, 2011 (JP) .................................. 2011-282453

(51) Int. Cl.
*H01L 29/66* (2006.01)
*H01L 29/786* (2006.01)
*H01L 29/78* (2006.01)

(52) U.S. Cl.
CPC ........ *H01L 29/786* (2013.01); *H01L 29/66795* (2013.01); *H01L 29/66742* (2013.01); *H01L 29/785* (2013.01); *H01L 2029/7858* (2013.01)
USPC 257/43; 257/57; 257/E29.273; 257/E33.003; 257/E33.004

(58) Field of Classification Search
CPC .................. H01L 29/786; H01L 29/66742
USPC ........ 257/43, 57, E29.273, E33.004, E33.003
See application file for complete search history.

(56) References Cited

U.S. PATENT DOCUMENTS 5,338,959 A 8/1994 Kim et al.
5,578,513 A 11/1996 Maegawa
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — David S Blum
(74) *Attorney, Agent, or Firm* — Eric J. Robinson; Robinson Intellectual Property Law Office, P.C.

(57) ABSTRACT

A structure including an oxide semiconductor layer which is provided over an insulating surface and includes a channel formation region and a pair of low-resistance regions between which the channel formation region is positioned, a gate insulating film covering a top surface and a side surface of the oxide semiconductor layer, a gate electrode covering a top surface and a side surface of the channel formation region with the gate insulating film positioned therebetween, and electrodes electrically connected to the low-resistance regions is employed. The electrodes are electrically connected to at least side surfaces of the low-resistance regions, so that contact resistance with the source electrode and the drain electrode is reduced.

9 Claims, 21 Drawing Sheets

(56) References Cited

U.S. PATENT DOCUMENTS

| | | |
|---|---|---|
| 5,583,362 A | 12/1996 | Maegawa |
| 5,731,856 A | 3/1998 | Kim et al. |
| 5,744,864 A | 4/1998 | Cillessen et al. |
| 5,986,306 A | 11/1999 | Nakajima et al. |
| 6,294,274 B1 | 9/2001 | Kawazoe et al. |
| 6,413,802 B1 | 7/2002 | Hu et al. |
| 6,563,174 B2 | 5/2003 | Kawasaki et al. |
| 6,600,197 B1 | 7/2003 | Nakajima et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,109,069 B2 | 9/2006 | Kokubo et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,892,898 B2 | 2/2011 | Oba |
| 8,089,117 B2 | 1/2012 | Shimizu |
| 8,093,593 B2 | 1/2012 | Kokubo et al. |
| 8,148,052 B2 | 4/2012 | Vanleenhove et al. |
| 8,274,079 B2 | 9/2012 | Yamazaki |
| 8,293,661 B2 | 10/2012 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0010990 A1* | 1/2003 | Misawa et al. ............ 257/88 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0240665 A1* | 10/2006 | Kang et al. ............ 438/653 |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140608 A1 | 6/2010 | Park et al. |
| 2012/0097963 A1 | 4/2012 | Kokubo et al. |
| 2012/0104396 A1* | 5/2012 | Pyo ............................ 257/59 |
| 2013/0001544 A1 | 1/2013 | Yamazaki |
| 2013/0015438 A1 | 1/2013 | Yamazaki |
| 2013/0069059 A1 | 3/2013 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-075127 A | 3/1993 |
| JP | 05-251705 A | 9/1993 |
| JP | 06-085256 | 3/1994 |
| JP | 07-135325 | 5/1995 |
| JP | 08-264794 A | 10/1996 |
| JP | 11-505377 | 5/1999 |
| JP | 11-177102 | 7/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-197916 | 7/2003 |
| JP | 2004-103957 A | 4/2004 |
| JP | 2004-273614 A | 9/2004 |
| JP | 2004-273732 A | 9/2004 |
| JP | 2009-206306 | 9/2009 |
| JP | 2010-509783 | 3/2010 |
| JP | 2011-014753 A | 1/2011 |
| JP | 2011-142310 A | 7/2011 |
| JP | 2011-181913 | 9/2011 |
| WO | WO-2004/114391 | 12/2004 |

(56) References Cited

FOREIGN PATENT DOCUMENTS

| WO | WO-2007/029482 | 3/2007 |
|---|---|---|
| WO | WO-2008/059440 | 5/2008 |
| WO | WO-2011/070900 | 6/2011 |

OTHER PUBLICATIONS

Dembo.H et al., "RFCPUS on Glass and Plastic Substrates Fabricated by TFT Transfer Technology,", IEDM 05: Technical Digest of Internation Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5) InGaO3(ZnO)3, and Ga2O3(ZnO)m (m =7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID

(56) References Cited

OTHER PUBLICATIONS

Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Techincal Papers, 2007, vol. 38, pp. 1673-1676.

Chern.H et al., "An Analytical Model for the Above-Threshold Characteristics of Polysilicon Thin-Film Transistors,", IEEE Transaction on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3—A2O3—BO Systems [A; Fe, Ga, or Al; B: Mg, Fe, Ni, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A. (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Disgest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor upon exposure to water,", Appl. Phys. Lett. (Applied Physics Letters) , 2008, vol. 92, pp. 072104-1-072104-3

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electronchemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

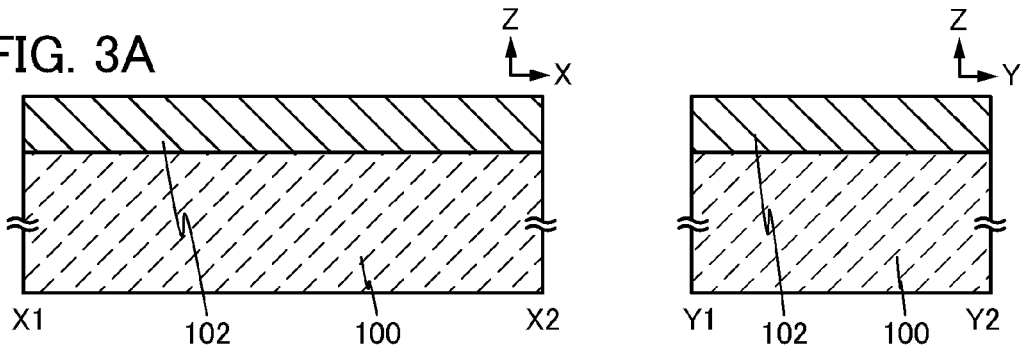
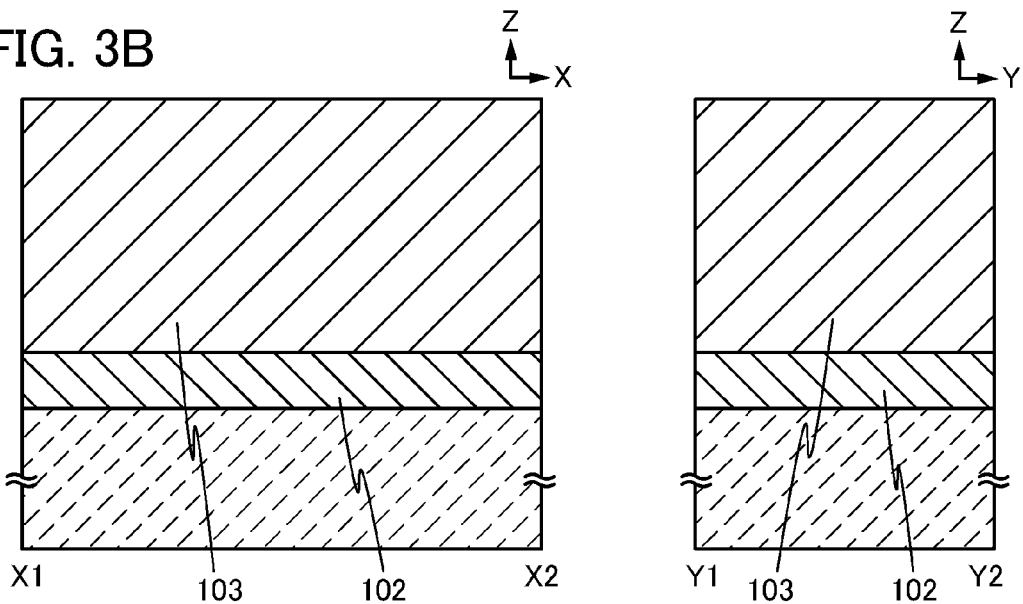
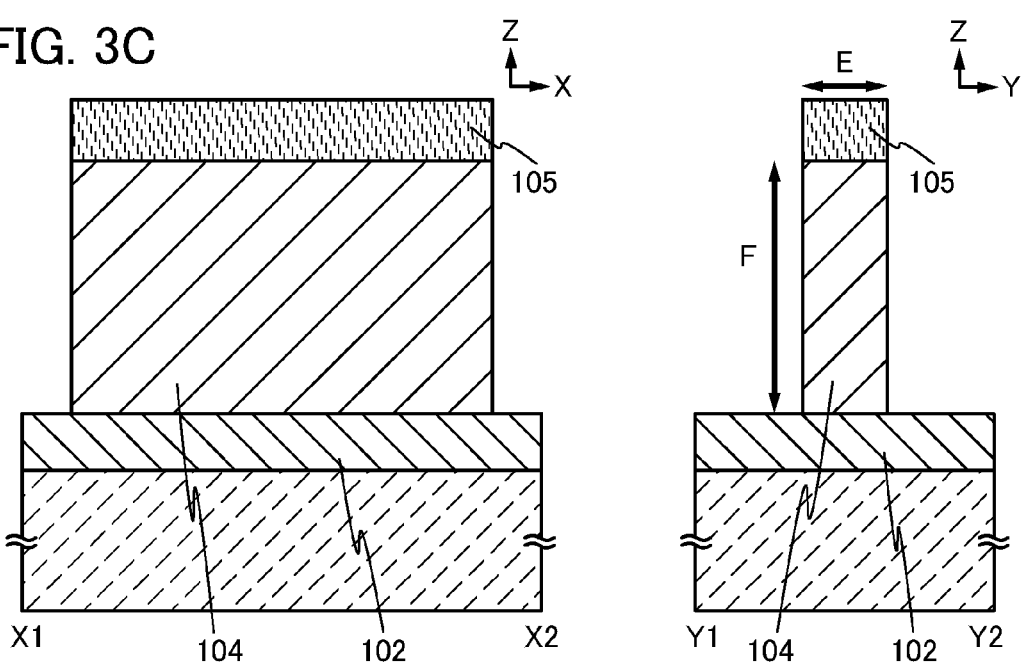

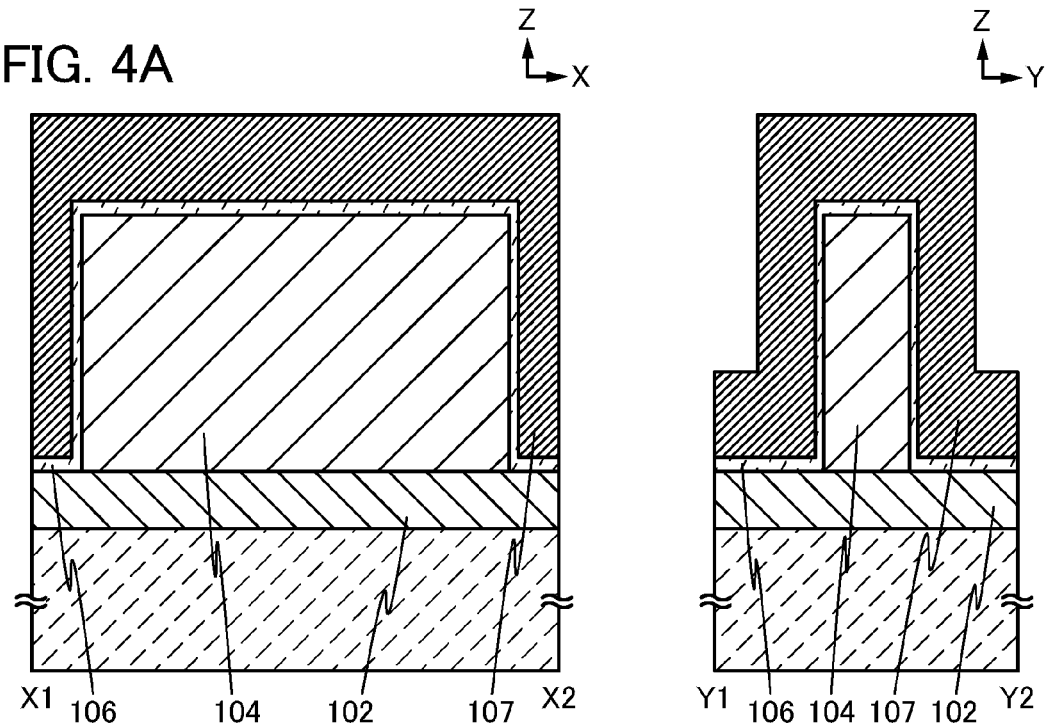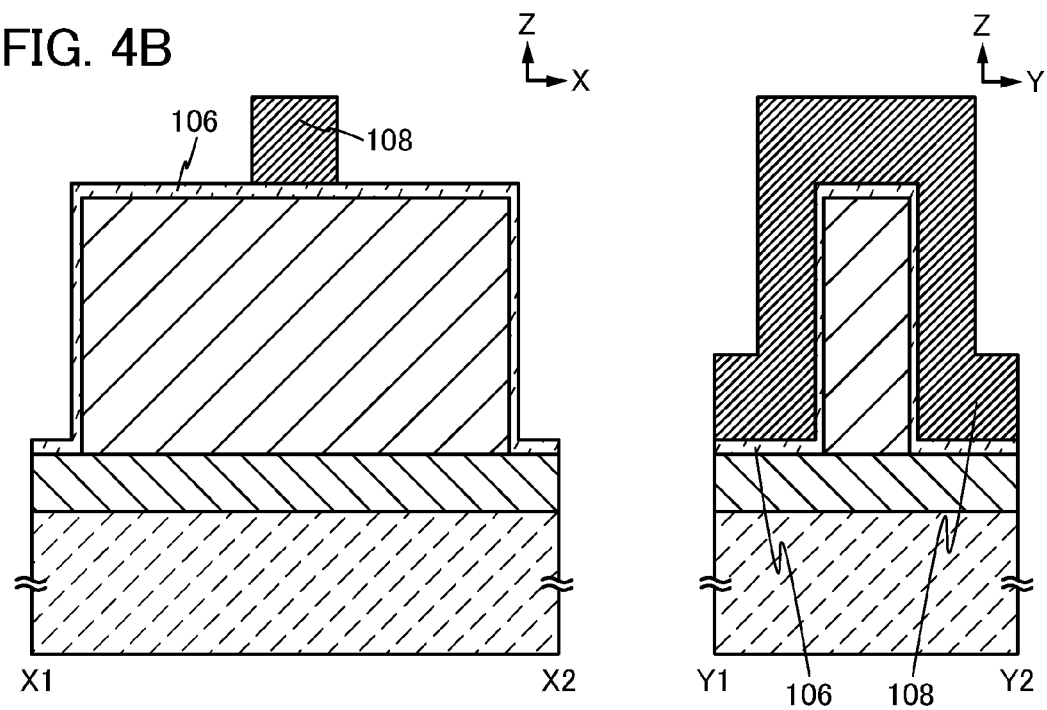

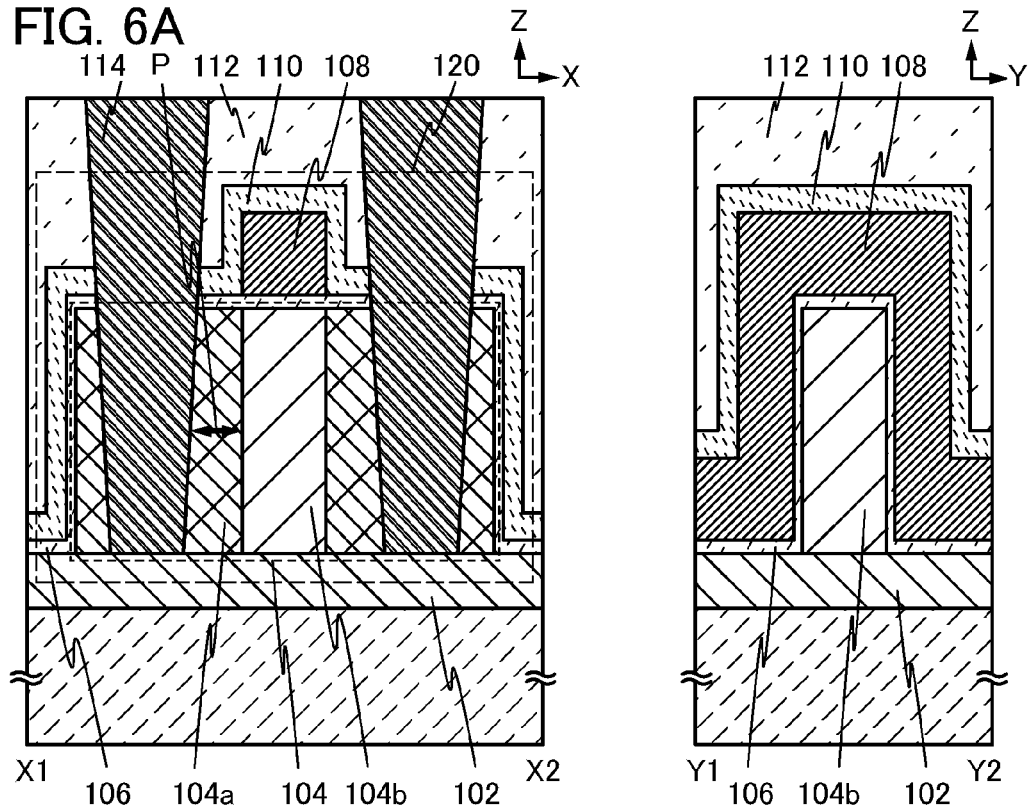
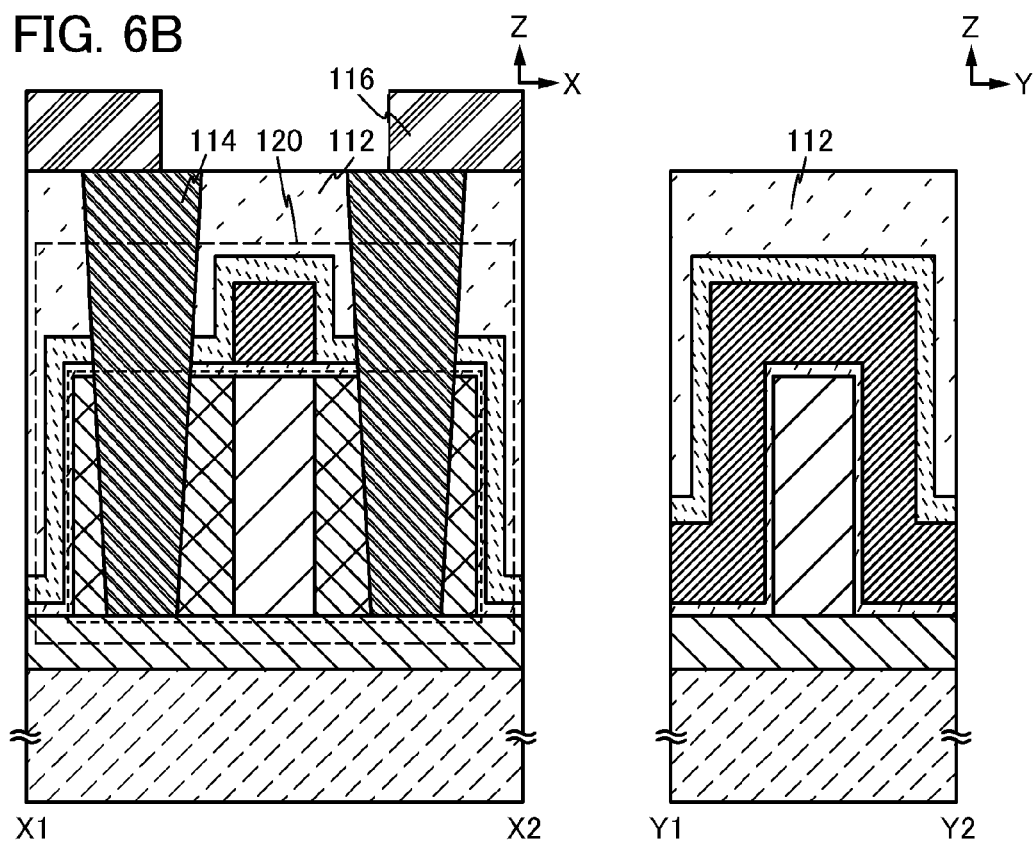

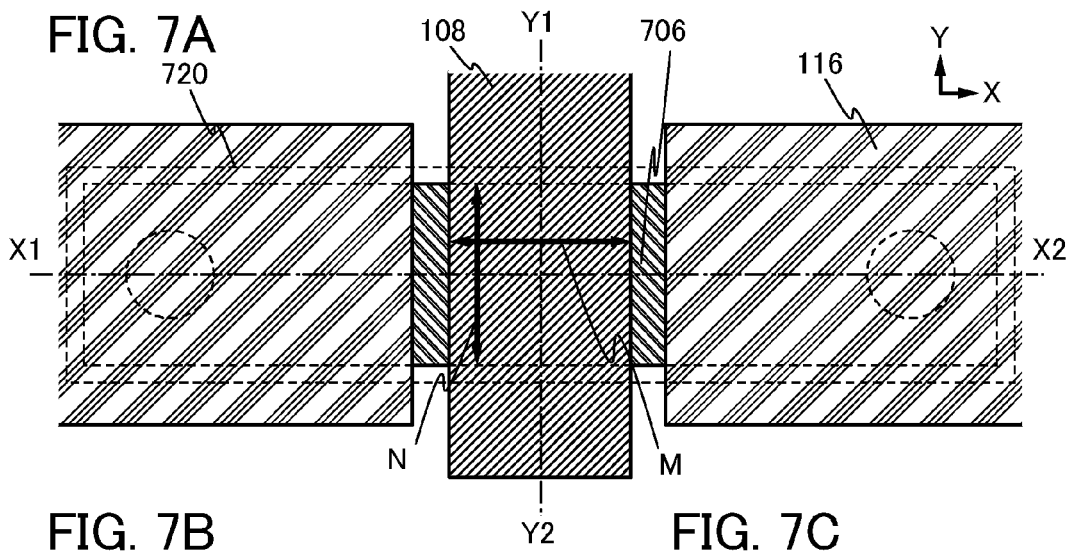
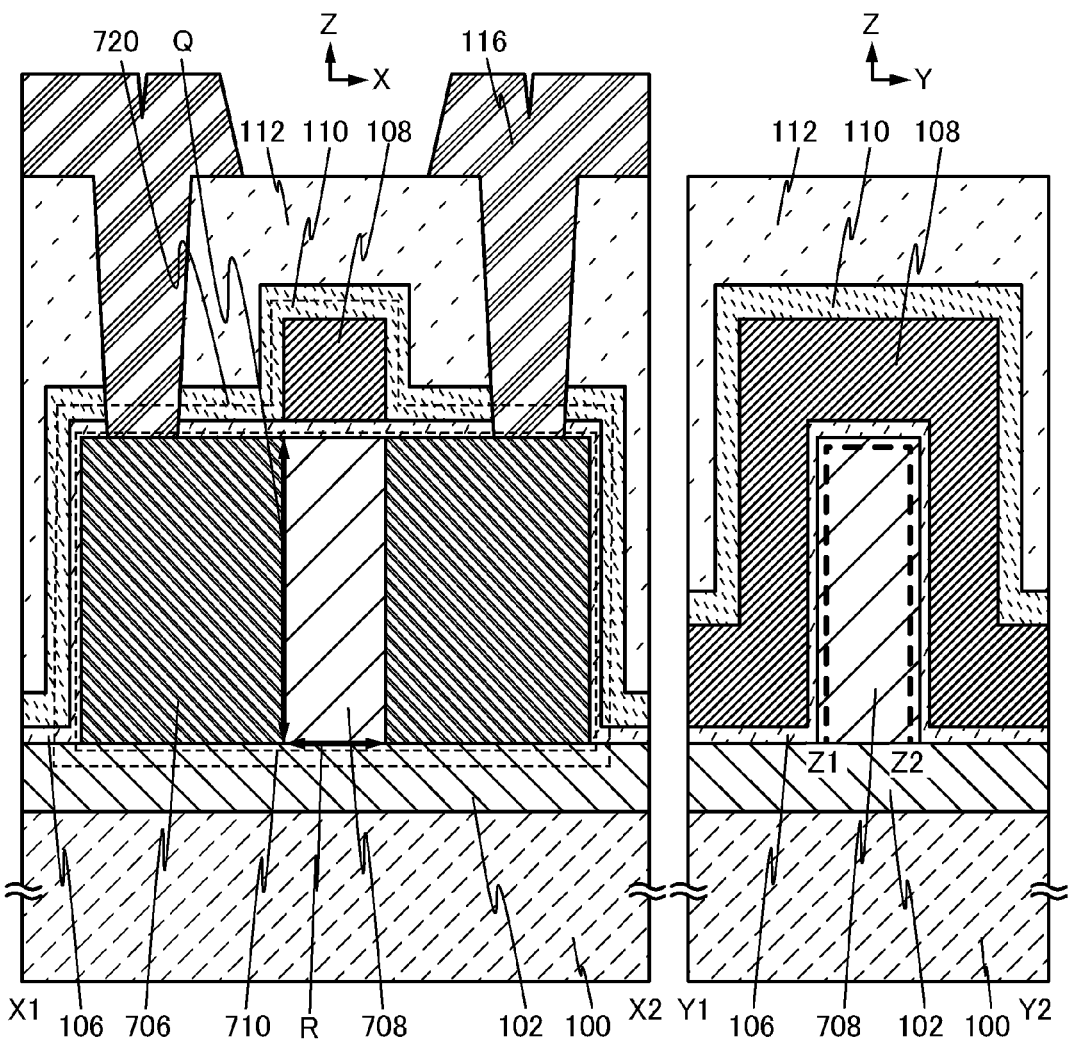

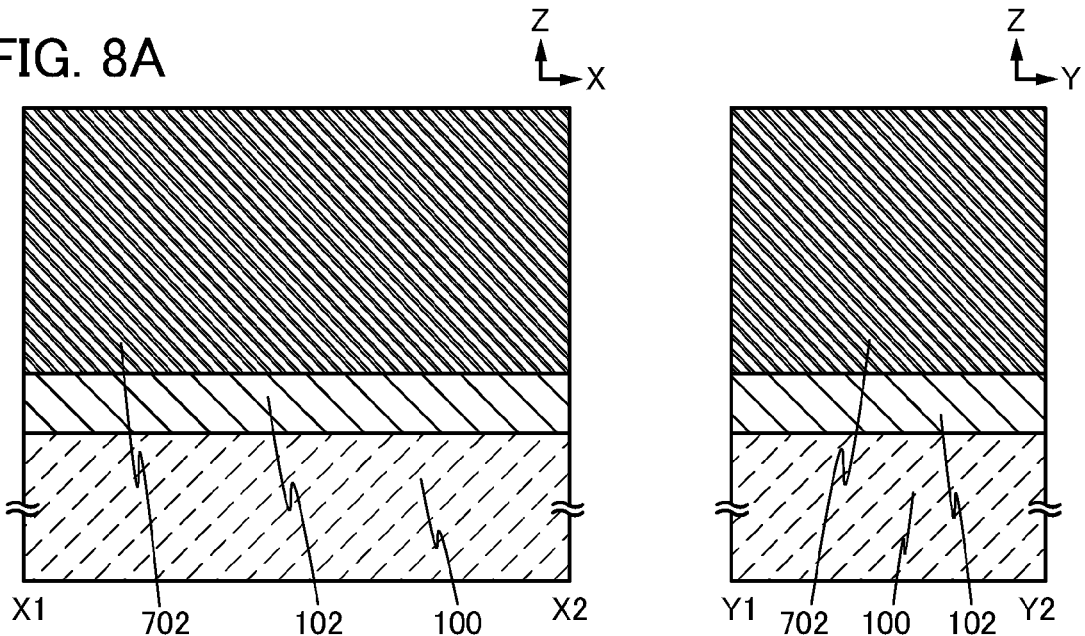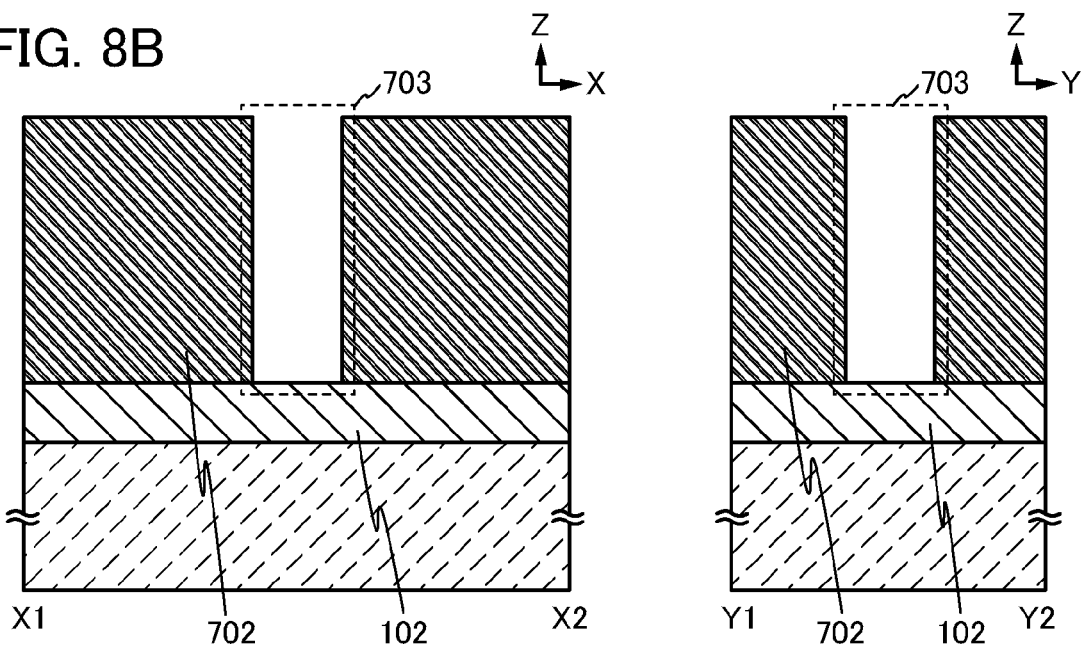

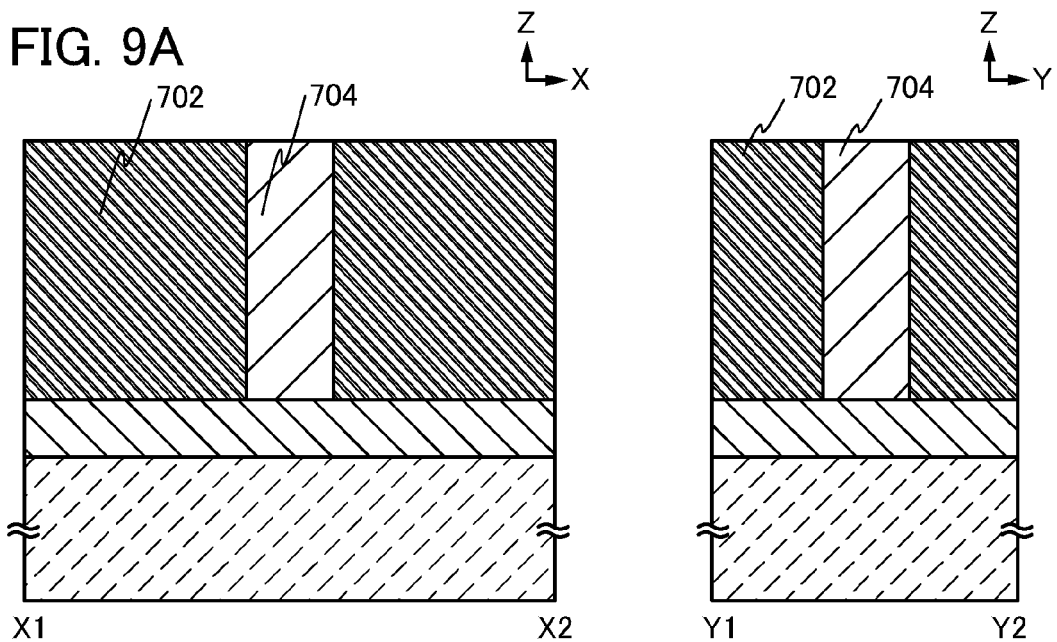
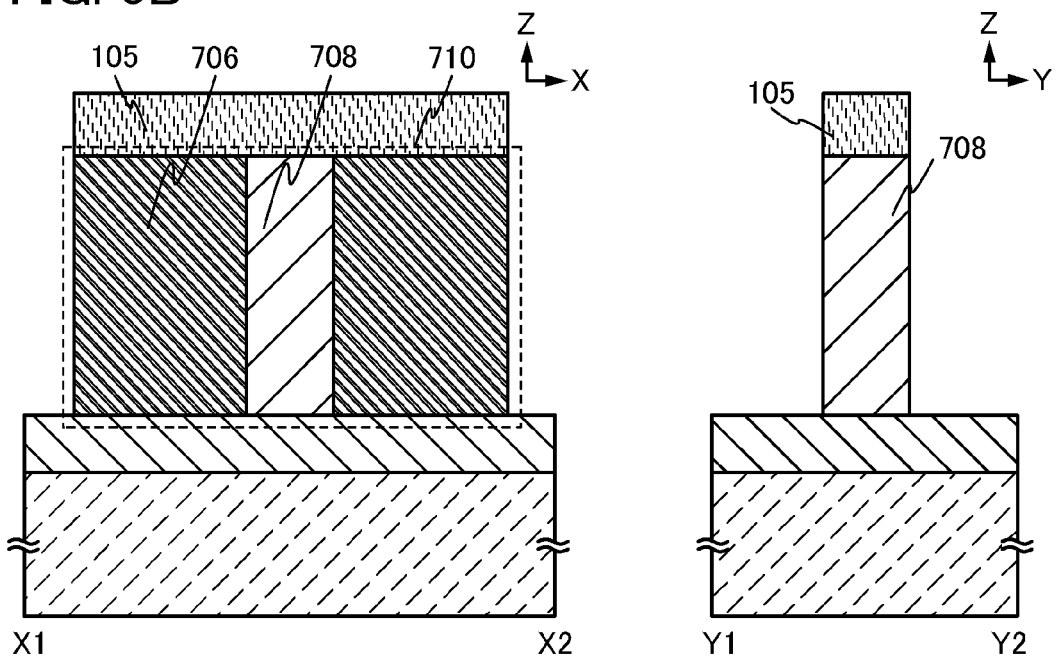

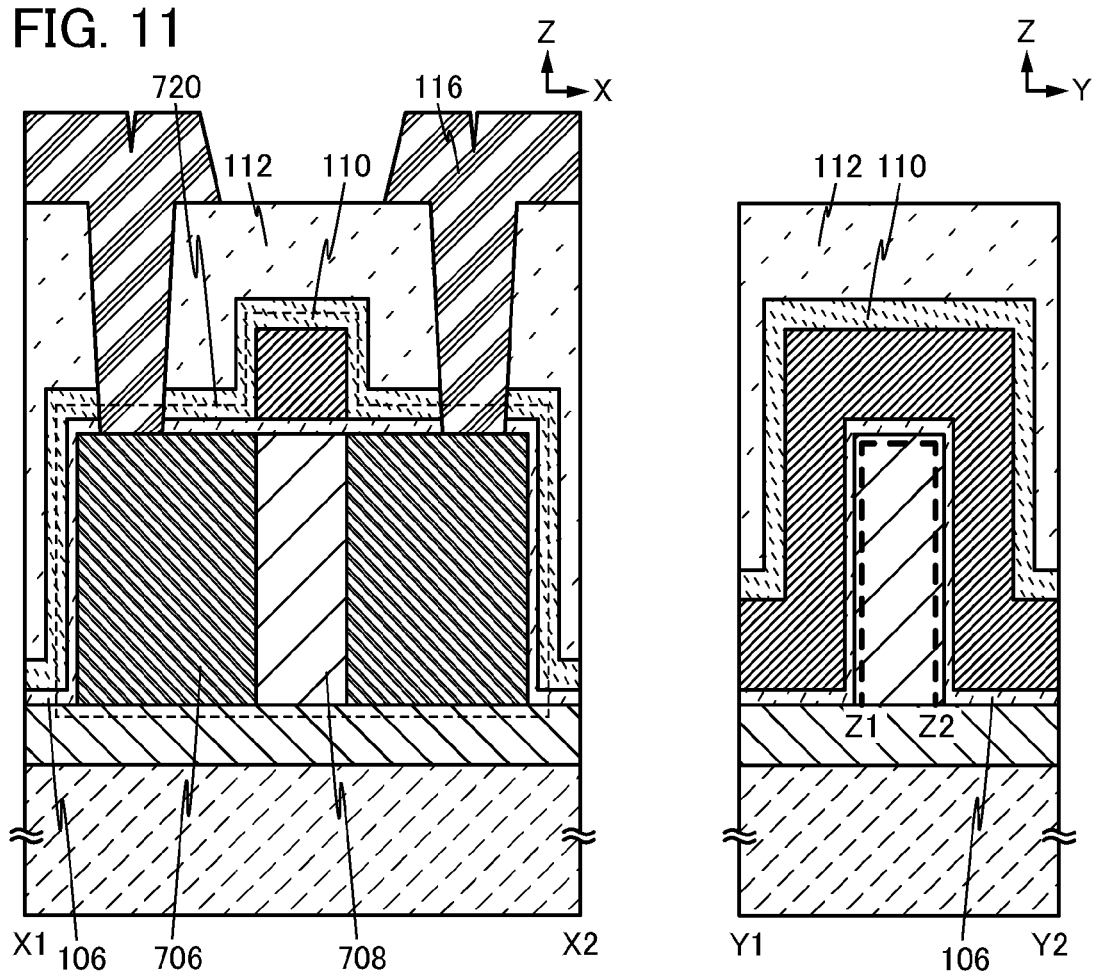

SEMICONDUCTOR ELEMENT, METHOD FOR MANUFACTURING THE SEMICONDUCTOR ELEMENT, AND SEMICONDUCTOR DEVICE INCLUDING THE SEMICONDUCTOR ELEMENT

BACKGROUND OF THE INVENTION

1. Field of the Invention

The present invention relates to a semiconductor element in which an oxide semiconductor is used for an active layer, a method for manufacturing the semiconductor element, and a semiconductor device including the semiconductor element.

In this specification, a "semiconductor element" refers to an element that can function by utilizing semiconductor characteristics, such as a transistor or a diode. Further, a "semiconductor device" refers to all the devices that can function by utilizing semiconductor characteristics of the semiconductor element; an electronic display device, an electro-optical device, and a memory device are all included in the category of the semiconductor device.

2. Description of the Related Art

Transistors in which an active layer is formed using a semiconductor thin film which is formed over a substrate having an insulating surface are widely used in electronic devices such as integrated circuits (ICs) and image display devices (display devices).

Conventional thin film transistors mostly have what is called a planar structure, in which a semiconductor layer, an insulating film, an electrode, and the like are stacked over a plane. With advances in manufacturing processes which enables miniaturization of such transistors, various problems such as increases in short-channel effect and leakage current arise. Therefore, in recent years, a transistor having a novel structure which is an alternative to the conventional planar structure has been developed. For example, Patent Document 1 discloses a fin-type transistor in which a polycrystalline silicon film is used as an active layer (referred to as a semiconductor thin film in Patent Document 1).

REFERENCE

Patent Document

[Patent Document 1] Japanese Published Patent Application No. 2009-206306

SUMMARY OF THE INVENTION

The thin film transistor in which the active layer has a fin-type structure as disclosed in Patent Document 1 can have small off-state current (current flowing between a source and a drain at the time when the transistor is in an off state) as compared to a planar thin film transistor; therefore, such a transistor is effective in reduction in power consumption. However, it is obvious that requirement for semiconductor devices with low power consumption will further increase in the future. Therefore, measures for further reduction in off-state current of thin film transistors are needed.

As one way to reduce an off-state current of a thin film transistor, the use of an oxide semiconductor material for an active layer in the transistor is proposed. It is reported that the transistor in which an oxide semiconductor material is used for an active layer has extremely small off-state current as compared to a transistor including a silicon-based semiconductor material and can be reduced in its off-state current to a level which cannot be measured by an ordinary method.

However, an oxide semiconductor material has relatively high contact resistance to a metal film which is generally used as an electrode or a wiring. In the case where the oxide semiconductor material is used for an active layer of a fin-type transistor which is miniaturized, there is a possibility that a reduction in an on-state current (a current flowing between a source and a drain at a time when the transistor is on) and variations in electrical characteristics (e.g., variations in threshold voltage) are caused owing to the contact resistance between the oxide semiconductor material and the metal film.

In view of the above problems, in this specification, one object is to provide a structure of a fin-type transistor which includes an oxide semiconductor material and in which a reduction in on-state current and an increase in variations in electrical characteristics which become significant with miniaturization of the transistor can be prevented, and another object is to provide a method for manufacturing the transistor.

In other words, one embodiment of the present invention is a semiconductor element including an oxide semiconductor layer which is provided over an insulating surface and includes a channel formation region and a pair of low-resistance regions between which the channel formation region is positioned, a gate insulating film covering a top surface and a side surface of the oxide semiconductor layer, a gate electrode covering a top surface and a side surface of the channel formation region with the gate insulating film positioned therebetween, and electrodes electrically connected to the low-resistance regions. The electrodes are electrically connected to at least side surfaces of the low-resistance regions.

The semiconductor element is formed according to the above embodiment, whereby even in the case of a minute fin-type transistor, the electrode is electrically connected to the low-resistance region in a large area of a side surface or the side surface and a bottom surface of a groove formed in the low-resistance region, so that a reduction in on-state current and an increase in variations in electrical characteristics due to an increase in contact resistance can be prevented.

Note that the electrode may be electrically connected to the low-resistance region through a groove formed in the low-resistance region. Accordingly, the low-resistance region and the electrode are in contact with each other in the side surface of the groove, so that contact resistance can be reduced. As a result, a reduction in on-state current and an increase in electrical characteristics due to an increase in contact resistance can be effectively prevented.

In addition, the electrode is formed to cross the low-resistance region in the channel width direction, whereby a contact area of the electrode and the low-resistance region can be increased. Thus, a reduction in on-state current and an increase in variations in electrical characteristics due to an increase in contact resistance can be effectively prevented.

Note that the length of the channel formation region in the channel width direction is preferably greater than or equal to 1 nm and less than or equal to 60 nm. When the length of the portion is less than or equal to 60 nm, a semiconductor element can be fully depleted or substantially fully depleted. It is difficult to process the portion when the length of the portion is less than 1 nm.

Note that in order to enhance effects of preventing the reduction in on-state current and reducing the variations in electrical characteristics by increasing the contact area of the electrode and the low-resistance region, it is preferable that the thickness of the channel formation region is greater than or equal to twice the length of the channel formation region in the channel width direction.

One embodiment of the present invention is a semiconductor element including a structure body which is provided over an insulating surface and includes an oxide semiconductor layer and a pair of electrodes between which the oxide semiconductor layer is positioned, a gate insulating film covering a top surface and a side surface of the structure body, and a gate electrode covering a top surface and a side surface of the oxide semiconductor layer with the gate insulating film positioned therebetween.

The semiconductor element is formed according to the above embodiment, whereby even in the case of a minute fin-type transistor, the oxide semiconductor layer and the electrode are electrically connected to each other in a large area and are direct in contact with each other without any component therebetween; therefore, a reduction in on-state current and an increase in variations in electrical characteristics due to an increase in contact resistance can be effectively prevented.

Note that the length of the oxide semiconductor layer in the channel width direction is preferably greater than or equal to 1 nm and less than or equal to 60 nm. When the length of the portion is less than or equal to 60 nm, a semiconductor element can be fully depleted or substantially fully depleted. It is difficult to process the portion when the length of the portion is less than 1 nm.

In order to enhance effects of preventing the reduction in on-state current and reducing the variations in electrical characteristics by increasing the contact area of the electrode and the oxide semiconductor layer, it is preferable that the thickness of the oxide semiconductor layer is greater than or equal to twice the length of the oxide semiconductor layer in the channel width direction.

Note that in the above embodiment, the oxide semiconductor layer contains at least indium or zinc as a main component and has a crystal-amorphous mixed phase structure in which a crystal portion and an amorphous portion are included in an amorphous phase, a c-axis of the crystal portion is aligned in a direction parallel to a normal vector of a surface where the oxide semiconductor film is formed or a normal vector of a surface of the oxide semiconductor film, triangular or hexagonal atomic arrangement which is seen from a direction perpendicular to an a-b plane is formed in the crystal portion, and metal atoms are arranged in a layered manner or metal atoms and oxygen atoms are arranged in a layered manner when seen from a direction perpendicular to the c-axis in the crystal portion, whereby a highly reliable semiconductor element in which a change in electrical characteristics due to light irradiation (also referred to as photodegradation) is suppressed can be obtained. Note that a main component refers to an element contained in composition at 5 atomic % or more.

One embodiment of the present invention is a method for manufacturing a semiconductor element, including the steps of forming an oxide semiconductor layer having an island shape over an insulating surface; forming a gate insulating film covering a top surface and a side surface of the oxide semiconductor layer; forming a gate electrode covering a top surface and a side surface of at least part of the oxide semiconductor layer with the gate insulating film positioned therebetween; performing ion-adding treatment on the oxide semiconductor layer to form a channel formation region and a pair of low-resistance regions between which the channel formation region is positioned in the oxide semiconductor layer; forming an interlayer insulating film covering the oxide semiconductor layer, the gate insulating film, and the gate electrode; forming grooves in which the low-resistance regions are exposed in at least part of side surfaces of the grooves, in the interlayer insulating film and the low-resistance regions; and forming electrodes over the interlayer insulating film to be electrically connected to the low-resistance regions through the grooves.

The semiconductor element is formed according to the above embodiment, whereby even in the case of a minute fin-type transistor, the low-resistance region and the electrode are electrically connected to each other in a large area; therefore, a reduction in on-state current and an increase in variations in electrical characteristics due to an increase in contact resistance can be effectively prevented.

Note that in the case where the groove is formed to cross the low-resistance region in the channel width direction and is formed so that the low-resistance region is exposed in at least part of a side surface of the groove, the low-resistance region and the electrode are in contact with each other in the side surface of the groove at the time when the electrode is formed in the groove, so that contact resistance can be reduced; therefore, a reduction in on-state current and an increase in variations in electrical characteristics due to an increase in contact resistance can be effectively prevented.

In addition, the oxide semiconductor layer preferably has a length greater than or equal to 1 nm and less than or equal to 60 nm in the channel width direction. When the length of the portion is less than or equal to 60 nm, the completed semiconductor element can be fully depleted or substantially fully depleted. In addition, the length of the portion is preferably greater than or equal to 1 nm in terms of processability.

In order to enhance effects of preventing the reduction in on-state current and reducing the variations in electrical characteristics by increasing the contact area of the electrode and the low-resistance region, it is preferable that the thickness of the channel formation region is greater than or equal to twice the length of the channel formation region in the channel width direction.

One embodiment of the present invention is a method for manufacturing a semiconductor element, including the steps of forming a conductive film including an opening in which an insulating surface is exposed, over the insulating surface; forming an oxide semiconductor film covering the conductive film; performing removal treatment on at least part of the oxide semiconductor film to expose the conductive film; processing the oxide semiconductor film and the conductive film to form a structure body including an oxide semiconductor layer and a pair of electrodes between which the oxide semiconductor layer is positioned; forming a gate insulating film covering a top surface and a side surface of the structure body; and forming a gate electrode covering a top surface and a side surface of the oxide semiconductor layer with the gate insulating film positioned therebetween.

Note that the above structure can also be manufactured through the steps of forming an oxide semiconductor film having an island shape over an insulating surface; forming a conductive film covering the oxide semiconductor film; performing removal treatment on at least part of the conductive film to expose the oxide semiconductor film; processing the oxide semiconductor film and the conductive film to form a structure body including an oxide semiconductor layer and a pair of electrodes between which the oxide semiconductor layer is positioned; forming a gate insulating film covering a top surface and a side surface of the structure body, over the structure body; and forming a gate electrode covering a top surface and a side surface of the oxide semiconductor layer with the gate insulating film positioned therebetween.

The semiconductor element is formed according to the above embodiment, whereby even in the case of a minute fin-type transistor, the oxide semiconductor layer and the electrode are electrically connected to each other in a large area and are direct in contact with each other without any component therebetween; therefore, a reduction in on-state current and an increase in variations in electrical characteristics due to an increase in contact resistance can be effectively prevented.

In addition, the structure body preferably has a length greater than or equal to 1 nm and less than or equal to 60 nm in the channel width direction. When the length of the portion is less than or equal to 60 nm, the completed semiconductor element can be fully depleted or substantially fully depleted. In addition, the length of the portion is preferably greater than or equal to 1 nm in terms of processability.

In order to enhance effects of preventing the reduction in on-state current and reducing the variations in electrical characteristics by increasing the contact area of the oxide semiconductor layer and the electrode, it is preferable that the thickness of the oxide semiconductor layer is greater than or equal to twice the length of the oxide semiconductor layer in the channel width direction.

The structure including an oxide semiconductor layer which is provided over an insulating surface and includes a channel formation region and a pair of low-resistance regions between which the channel formation region is positioned, a gate insulating film covering a top surface and a side surface of the oxide semiconductor layer, a gate electrode covering a top surface and a side surface of the channel formation region with the gate insulating film positioned therebetween, and electrodes electrically connected to the low-resistance regions is employed, in which the electrodes are electrically connected to at least side surfaces of the low-resistance regions. Alternatively, the structure including a structure body which is provided over an insulating surface and includes an oxide semiconductor layer and a pair of electrodes between which the oxide semiconductor layer is positioned, a gate insulating film covering a top surface and a side surface of the structure body, and a gate electrode covering a top surface and a side surface of the oxide semiconductor layer with the gate insulating film positioned therebetween is employed. In any of the structures, the oxide semiconductor layer and the electrode are in contact with each other in a large area, and thus contact resistance between the electrode and the low resistance region can be reduced.

BRIEF DESCRIPTION OF THE DRAWINGS

FIGS. 3A to 3C are cross-sectional views illustrating an example of a manufacturing process of a semiconductor device.

FIGS. 4A and 4B are cross-sectional views illustrating an example of a manufacturing process of a semiconductor device.

FIGS. 6A and 6B are cross-sectional views illustrating an example of a manufacturing process of a semiconductor device.

FIGS. 7A to 7C are a plan view and cross-sectional views illustrating one embodiment of a semiconductor device.

FIGS. 8A and 8B are cross-sectional views illustrating an example of a manufacturing process of a semiconductor device.

FIGS. 9A and 9B are cross-sectional views illustrating an example of a manufacturing process of a semiconductor device.

FIG. 11 is cross-sectional views illustrating an example of a manufacturing process of a semiconductor device.

DETAILED DESCRIPTION OF THE INVENTION

Figure 1A:
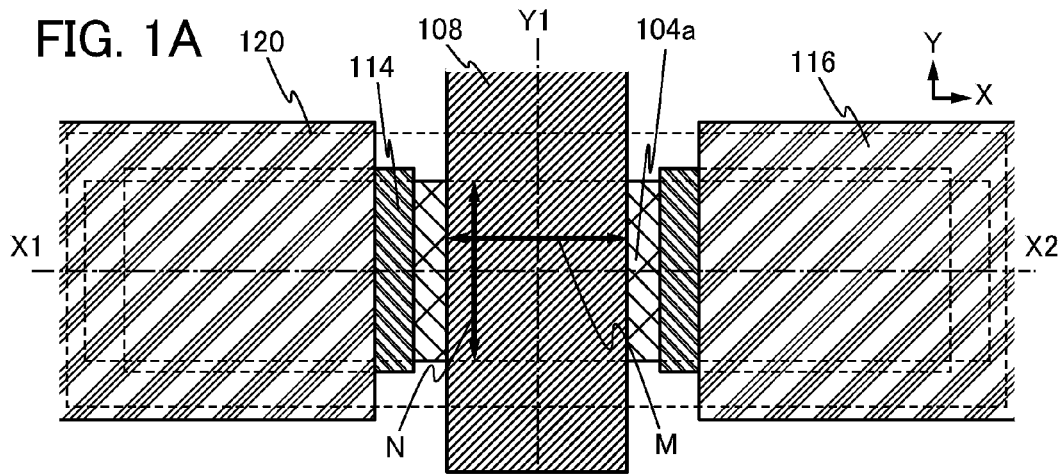
FIGS. 1A to 1C are a plan view and cross-sectional views illustrating one embodiment of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

In the following embodiments, the same portions or portions having similar functions are denoted by the same reference numerals in different drawings, and explanation thereof will not be repeated.

Note that the position, the size, the range, or the like of each structure illustrated in drawings and the like is not accurately represented in some cases for easy understanding. Therefore, the disclosed invention is not necessarily limited to the position, the size, the range, or the like as disclosed in the drawings and the like.

In this specification and the like, ordinal numbers such as "first", "second", and "third" are used in order to avoid confusion among components, and the terms do not mean limitation of the number of components.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

(Embodiment 1)

In this embodiment, an example of the structure of a semiconductor element and a method for manufacturing the semiconductor element will be described with reference to FIGS. 1A to 1C, FIGS. 2A to 2C, FIGS. 3A to 3C, FIGS. 4A and 4B, and FIGS. 5A and 5B.

<Structural Example of Semiconductor Element>

Figure 1B:
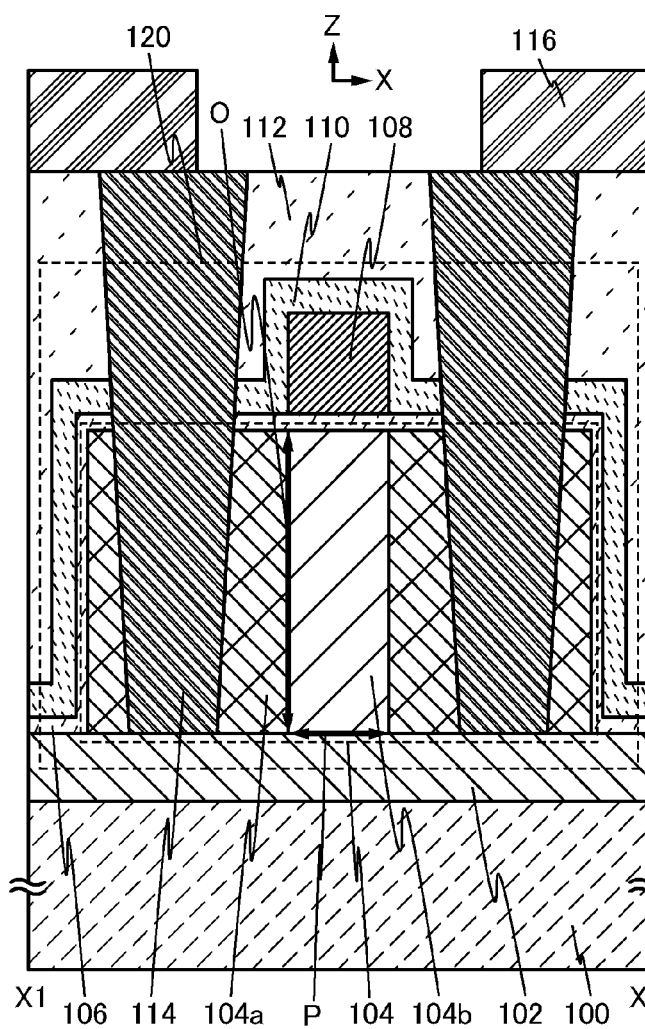
Figure 1C:
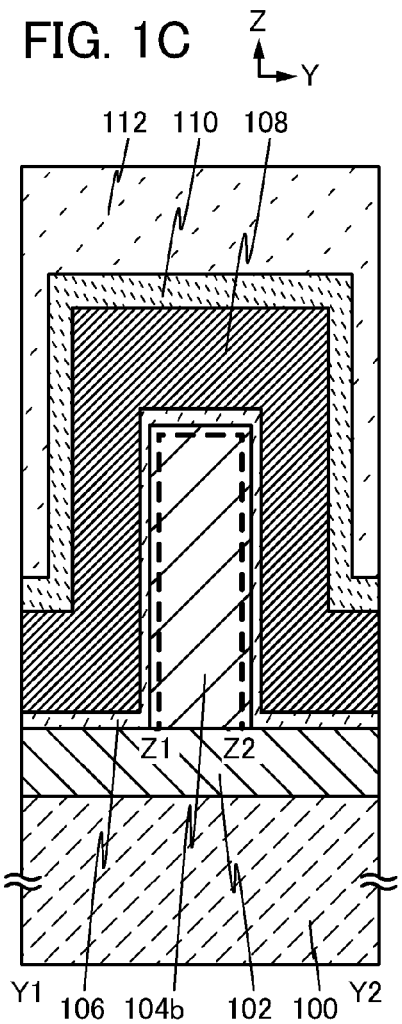

FIGS. 1A to 1C illustrate an example of a plan view and cross-sectional views of a top-gate transistor which is an example of a semiconductor element. FIG. 1A is a plan view. FIG. 1B is a cross-sectional view taken along dashed-dotted line X1-X2 in FIG. 1A. FIG. 1C is a cross-sectional view taken along dashed-dotted line Y1-Y2 in FIG. 1A. Note that in FIG. 1A, some components (e.g., a substrate 100) of a transistor 120 are not illustrated to avoid complexity.

The transistor 120 illustrated in FIGS. 1A to 1C includes a base film 102 which is provided over the substrate 100, an oxide semiconductor layer 104 which is provided over the base film 102 and includes low-resistance regions 104a and a channel formation region 104b, a gate insulating film 106 which covers the oxide semiconductor layer 104, a gate electrode 108 which covers a top surface and a side surface of the channel formation region 104b with the gate insulating film 106 positioned therebetween, a first interlayer insulating film 110 and a second interlayer insulating film 112 which cover the gate insulating film 106 and the gate electrode 108, and electrodes 114 which are electrically connected to the low-resistance regions 104a in at least portions of side surfaces of grooves provided in the low-resistance regions 104a, the gate insulating film 106, the first interlayer insulating film 110, and the second interlayer insulating film 112. Note that the electrodes 114 are electrically connected to wirings 116. Although not illustrated, the transistor 120 is electrically connected to another semiconductor element (e.g., a transistor) through the wiring 116.

When the oxide semiconductor layer 104 is seen from a direction perpendicular to the base film 102 as illustrated in FIG. 1A, the channel length direction of the channel formation region 104b and the channel width direction thereof may be referred to as an X-axis direction (or X1-X2 direction) and a Y-axis direction (or Y1-Y2 direction), respectively. In addition, a direction perpendicular to an X-Y plane may be referred to as a Z-axis direction.

Contact areas of the low-resistance regions 104a and the electrodes 114 become smaller as the size of the transistor 120 is reduced. However, even in such a case, the use of the structure in FIGS. 1A to 1C in which the electrodes 114 are embedded in the grooves formed in the low-resistance regions 104a enables the electrodes 114 to be in contact with the low-resistance regions 104a in the side surfaces of the grooves; therefore, the low-resistance regions 104a and the electrodes 114 can be electrically connected to each other in large areas. Accordingly, a reduction in on-state current and an increase in variations in electrical characteristics due to an increase in contact resistance can be prevented even in a minute fin-type transistor.

The effect of reducing contact resistance is enhanced as the length of a side which is an interface between the channel formation region 104b and the low-resistance region 104a (the length of a thick arrow O in FIG. 1B) becomes longer than the length of a side which is an interface between the channel formation region 104b and the base film 102 (the length of a thick arrow P in FIG. 1B) in a cross section of the oxide semiconductor layer 104 taken along the longitudinal direction of the oxide semiconductor layer 104 as illustrated in FIG. 1B. Specifically, the length of the side which is the interface between the channel formation region 104b and the low-resistance region 104a (also referred to as the thickness of the channel formation region 104b) is preferably greater than or equal to twice the length of the side which is the interface between the channel formation region 104b and the base film 102 (also referred to as the length of the channel formation region 104b in the channel length direction).

In addition, as the size of the transistor 120 becomes small, the channel length (a length denoted by a thick arrow M in FIG. 1A) and the channel width (a length denoted by a thick arrow N in FIG. 1A) are reduced. If the channel width is very small, even when processing variations generated in the channel width direction are small at the time of processing the oxide semiconductor layer 104, the processing variations might have a large influence on variations in electrical characteristics (such as variations in threshold voltage) because the channel width W itself is very small.

However, when voltage is applied to the gate electrode 108 in the structure where the oxide semiconductor layer 104 including the channel formation region 104b has a thin-plate shape, a channel portion is formed in U-shape in the channel formation region 104b in the vicinity of an interface with the gate insulating film 106 as shown by a thick dotted line Z1-Z2 in FIG. 1C. Therefore, a change in the channel width (the length of the thick arrow N in FIG. 1A) which is generated in the processing of the oxide semiconductor layer 104 has a relatively small influence on variations in electrical characteristics of the transistor 120.

An oxide semiconductor used for the thin-plate-shaped oxide semiconductor layer 104 contains at least indium (In). In particular, the oxide semiconductor preferably contains In and zinc (Zn).

The oxide semiconductor layer 104 is in a single crystal state, a polycrystalline (also referred to as polycrystal) state, an amorphous state, or the like.

The oxide semiconductor layer 104 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned with a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and layers each containing metal atoms and oxygen atoms overlap with each other. Note that the direction of a normal vector of the layers is a c-axis direction. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal portion is formed by deposition or by performing treatment for crystallization such as heat treatment after deposition.

With the use of the CAAC-OS film in a transistor, change in electric characteristics of the transistor due to irradiation with visible light or ultraviolet light is small. Thus, the transistor has high reliability.

Note that nitrogen may be substituted for part of oxygen included in the oxide semiconductor film.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm. Therefore, planarization treatment is preferably performed on a surface over which the oxide semiconductor is to be formed. As the planarization treatment, chemical mechanical polishing (CMP) treatment, a dry etching method, or the like may be used. Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface over which the oxide semiconductor is to be formed can be further improved.

Note that Ra is obtained by expanding, into three dimensions, arithmetic mean surface roughness that is defined by JIS B 0601: 2001 (ISO4287:1997) so as to be able to apply it to a curved surface. Ra can be expressed as an "average value of the absolute values of deviations from a reference surface to a designated surface" and is defined by Formula (1).

$$Ra = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

As illustrated in FIG. 1B, the oxide semiconductor layer 104 includes the low-resistance regions 104a to which an impurity for reducing electrical resistance is added and the channel formation region 104b sandwiched between the pair of low-resistance regions 104a. Note that in the transistor 120, carriers (electrons or holes) are supplied from one of the pair of low-resistance regions 104a to the channel formation region 104b, and carriers (electrons or holes) are output from the channel formation region 104b to the other of the pair of low-resistance regions 104a; therefore, the low-resistance regions 104a can be referred to as a source region and a drain region.

Note that the length of the channel formation region 104b in the channel width direction (i.e., the length of the thick arrow N in FIG. 1A) is preferably greater than or equal to 1 nm and less than or equal to 60 nm when the oxide semiconductor layer 104 is seen from the direction perpendicular to the base film 102. The length of the portion is less than or equal to 60 nm and the gate electrode 108 covers the channel formation region 104b with the gate insulating film 106 positioned therebetween, whereby the channel formation region 104b can be fully depleted or substantially fully depleted. Accordingly, the transistor 120 can have not only an extremely small off-state current but also characteristics of a fully depleted transistor, such as favorable subthreshold characteristics. Note that since the oxide semiconductor layer 104 is formed in thin-plate shape (which is also represented as a thin piece shape), when the oxide semiconductor layer 104 is too thin, a problem arises in that processing becomes difficult. Therefore, it is preferable that the length of the portion is greater than or equal to 1 nm.

As illustrated in FIGS. 1B and 1C, the gate electrode 108 is provided over the oxide semiconductor layer 104 and covers the top surface and the side surface of the channel formation region 104b with the gate insulating film 106 positioned therebetween.

Although end portions of the gate electrode 108 overlap with end portions of the channel formation region 104b in FIGS. 1A to 1C, this structure is not necessarily employed. For instance, part of the gate electrode 108 may overlap with the low-resistance region 104a (see FIG. 2A).

The length of the gate electrode 108 in the X1-X2 direction (the length can also be referred to as the width of the gate electrode 108) is uniform in FIG. 1A but is not necessarily uniform. For example, when the gate electrode 108 is electrically connected to another semiconductor element (e.g., a transistor), part of the gate electrode 108 also functions as a wiring; therefore, in this case, wiring resistance can be reduced by increasing the width of part of the gate electrode 108 which does not overlap with the oxide semiconductor layer 104.

The electrodes 114 are electrically connected to the low-resistance regions 104a in at least the side surfaces of the grooves formed in the gate insulating film 106, the first interlayer insulating film 110, and the second interlayer insulating film 112, and the electrodes 114 function as a source electrode and a drain electrode of the transistor 120. In addition, a conductive film which is formed in the same process as the electrodes 114 may be used as a wiring for electrical connection between semiconductor elements, for example.

Note that part of the base film 102 is exposed in the grooves in FIG. 1B; however this embodiment is not limited to this structure. For example, the bottom portions of the electrodes 114 may be positioned in the low-resistance regions 104a as illustrated in FIG. 2B. Such a structure enables the electrodes 114 to be electrically connected to the low-resistance regions 104a in the side surfaces and the bottom surfaces of the electrodes 114, so that contact resistance can be effectively reduced. In addition, time for forming the grooves can be reduced and thus time for manufacturing the semiconductor element can be reduced. In terms of processability, the electrode 114 may be in contact with one side surface of the low-resistance region 104a as illustrated in FIG. 2C.

Note that when the oxide semiconductor layer 104 is seen from the direction perpendicular to the base film 102 as illustrated in FIG. 1A, the electrodes 114 preferably cross the low-resistance regions 104a in the channel width direction (also referred to as the Y-axis direction). Accordingly, the contact area of the electrode and the low-resistance region can be increased, so that a reduction in on-state current and an increase in variations in electrical characteristics due to an increase in contact resistance can be effectively prevented.

The electrodes 114 are electrically connected to another semiconductor element (e.g., a transistor) through the wirings 116.

<Method for Manufacturing Transistor 120>

An example of a manufacturing process of the transistor 120 in FIGS. 1A to 1C will be described with reference to FIGS. 3A to 3C, FIGS. 4A and 4B, and FIGS. 5A and 5B.

First, the substrate 100 having an insulating surface is prepared, and the base film 102 is formed over the substrate 100 (see FIG. 3A).

There is no particular limitation on a substrate that can be used as the substrate 100 having an insulating surface as long as it has at least heat resistance to withstand heat treatment performed later. For example, a glass substrate of barium borosilicate glass, aluminoborosilicate glass, or the like, a ceramic substrate, a quartz substrate, or a sapphire substrate can be used. As long as the substrate 100 has an insulating surface, a single crystal semiconductor substrate or a polycrystalline semiconductor substrate of silicon, silicon carbide, or the like; a compound semiconductor substrate of silicon germanium or the like; an SOI substrate; or the like can be used.

A flexible substrate may alternatively be used as the substrate 100. In the case where a flexible substrate is used, the transistor 120 including the oxide semiconductor layer 104 may be directly formed over the flexible substrate, or alternatively, the transistor 120 including the oxide semiconductor layer 104 may be formed over another manufacturing substrate and separated from the manufacturing substrate to be transferred to the flexible substrate. Note that in order to separate the transistor from the manufacturing substrate and transfer it to the flexible substrate, a separation layer may be provided between the manufacturing substrate and the transistor 120 including the oxide semiconductor layer 104.

Note that the substrate 100 is preferably made to shrink (also referred to as thermally shrink) by heat treatment performed in advance at a temperature lower than a strain point of the substrate 100, whereby shrinkage caused by heating of the substrate in the manufacturing process of the transistor 120 can be suppressed. Thus, misalignment of masks in a light exposure process or the like can be suppressed, for example. In addition, moisture and organic substances which are attached to the surface of the substrate 100 can be removed by the heat treatment.

The base film 102 has a function of preventing diffusion of impurities (e.g., metal elements such as aluminum, magnesium, strontium, and boron, hydrogen, and water) from the substrate 100 to the oxide semiconductor layer 104, and preventing adverse influence on the electrical characteristics of the transistor 120 (for example, preventing a normally-on state of a transistor (shift of the threshold value in the negative direction), the occurrence of variation in threshold value, and a reduction in field-effect mobility).

The base film 102 can be formed by a vacuum evaporation method, a physical vapor deposition (PVD) method such as a sputtering method, or a chemical vapor deposition (CVD) method such as a plasma CVD method to have a single-layer structure or a stacked-layer structure including one or more of a silicon oxide film, a silicon oxynitride film, a silicon nitride film, a silicon nitride oxide film, an aluminum oxide film, an aluminum nitride film, an aluminum oxynitride film, an aluminum nitride oxide film, and the like. Note that in this specification, a "silicon oxynitride film" refers to a film that includes more oxygen than nitrogen, and a "silicon nitride oxide film" refers to a film that includes more nitrogen than oxygen.

In view of improving productivity and preventing diffusion of the impurity, the base film 102 preferably has a thickness greater than or equal to 50 nm and less than or equal to 500 nm.

When oxygen vacancy exists in the channel formation region 104b of the transistor 120, charge is generated owing to the oxygen vacancy in some cases. In general, part of oxygen vacancy in an oxide semiconductor film serves as a donor to release an electron which is a carrier. As a result, the threshold voltage of the transistor shifts in the negative direction. Thus, it is preferable that the base film 102 contains enough oxygen so as to sufficiently supply oxygen to the oxide semiconductor layer.

When oxygen is contained in the base film 102, part of the oxygen in the base film 102 can be released by heat treatment after the formation of an oxide semiconductor film 103 described later, and can be supplied to the oxide semiconductor film 103 (or the oxide semiconductor layer 104) to compensate the oxygen vacancy in the oxide semiconductor film 103 (or the oxide semiconductor layer 104). As a result, it is possible to suppress a shift of the threshold voltage of the transistor in the negative direction. In particular, the base film 102 preferably contains oxygen in a proportion higher than that of oxygen in the stoichiometric composition in (a bulk of) the film. For example, in the case where silicon oxide is used as the base film 102, a film of silicon oxide represented by $SiO_{2+\alpha}$ ($\alpha>0$) is preferably used. Note that a region containing oxygen in a proportion higher than that of oxygen in the stoichiometric composition (hereinafter referred to as an "oxygen-excessive region" in some cases) may exist in at least part of the base film 102.

In the case where a function of supplying oxygen to the oxide semiconductor film 103 (or the oxide semiconductor layer 104) by heat treatment is given to the base film 102, the base film 102 is preferably formed with a stack of a film having low oxygen permeability and a film having a high oxygen-supplying property so that the oxygen released from the base film 102 is efficiently supplied to the oxide semiconductor film 103 (or the oxide semiconductor layer 104). For instance, the base film 102 may be a film in which an aluminum oxide film (which is formed on a side in contact with the substrate 100) having low oxygen permeability and a silicon oxide film (which is formed on a side in contact with the oxide semiconductor film 103) containing oxygen in a proportion higher than that in the stoichiometric composition are stacked.

It is preferable that the base film 102 contains as few hydrogen atoms as possible. This is because when hydrogen atoms are contained in the oxide semiconductor film 103 which is formed later steps, the hydrogen atoms are bonded to an oxide semiconductor, so that part of the hydrogen serves as a donor and electrons serving as carriers are generated, and as a result, the threshold voltage of the transistor is shifted in the negative direction. Therefore, in terms of a reduction in the hydrogen atoms in the film, it is preferable to use physical vapor deposition (PVD) such as a sputtering method for the deposition of the base film 102, whereas in terms of reductions in variations in plane, particles to be mixed, and formation cycles, it is effective to use a CVD method for the deposition of the base film 102. A CVD method is also effective in forming a film on a large-sized substrate because of the above effect.

In the case where the base film 102 is deposited by a CVD method (e.g., a plasma CVD method), a gas containing hydrogen, such as a silane gas ($SiH_4$) is used as a deposition gas, and therefore, a large amount of hydrogen is contained in the base film 102.

Therefore, after the base film 102 is deposited by a CVD method, heat treatment for the purpose of removal of hydrogen atoms in a film (herein heat treatment for the purpose of removal of hydrogen atom in the film is referred to as "dehydration treatment" or "dehydrogenation treatment") needs to be performed on the deposited base film 102. The heat treatment is performed at a temperature higher than or equal to 250° C. and lower than or equal to 650° C., preferably higher than or equal to 450° C. and lower than or equal to 600° C. or lower than the strain point of the substrate. For example, the substrate may be introduced into an electric furnace, which is one kind of heat treatment apparatuses, and heat treatment may be performed on the base film 102 at 650° C. for one hour in a vacuum (reduced pressure) atmosphere.

Further, the heat treatment apparatus is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high temperature gas, an inert gas which does not react with an object by heat treatment, such as nitrogen or a rare gas like argon, is used. Note that in the case where a GRTA apparatus is used as the heat treatment apparatus, the substrate may be heated in an inert gas heated to a high temperature of 650° C. to 700° C. because the heat treatment time is short.

The heat treatment may be performed in an atmosphere of nitrogen, oxygen, ultra-dry air (the moisture content is less than or equal to 20 ppm, preferably less than or equal to 1 ppm, further preferably less than or equal to 10 ppb), or a rare gas (such as argon or helium). Note that it is preferable that water, hydrogen, and the like are not contained in the atmosphere of nitrogen, oxygen, ultra-dry air, a rare gas, or the like. It is also preferable that the purity of nitrogen, oxygen, or the rare gas which is introduced into a heat treatment apparatus is set to be 6N (99.9999%) or higher, preferably 7N (99.99999%) or higher (that is, the impurity concentration is 1 ppm or lower, preferably 0.1 ppm or lower).

In the case where the heat treatment is performed on the base film 102, there is a possibility that part of oxygen as well as hydrogen is removed from the base film 102. Thus, after the heat treatment is performed, treatment for introducing oxygen to the base film 102 (hereinafter referred to as "oxygen-introducing treatment") may be performed. Note that the oxygen which is injected to the base film 102 by the oxygen-introducing treatment contains at least one of an oxygen radial, ozone, an oxygen atom, and an oxygen ion (including a molecular ion and a cluster ion). By performing the oxygen-introducing treatment on the base film 102 which has been subjected to the dehydration treatment or dehydrogenation treatment, oxygen can be contained in the base film 102, thereby compensating the oxygen which is released from the base film 102 by the dehydration treatment or dehydrogenation treatment. In addition, the part of the oxygen in the base film 102 is released by the heat treatment performed after the formation of the oxide semiconductor film 103 described later, so that oxygen is supplied to the oxide semiconductor film 103 (or the oxide semiconductor layer 104) to compensate the oxygen vacancy in the oxide semiconductor film 103 (or the oxide semiconductor layer 104).

The oxygen introduction to the base film 102 can be performed by an ion implantation method, an ion doping method, a plasma immersion ion implantation method, plasma treatment, or the like, for example. Note that a gas cluster ion beam may be used in an ion implantation method. The oxygen-introducing treatment may be performed for the entire surface of the substrate 100 by one step or may be performed using a linear ion beam, for example. In the case where the linear ion beam is used, the substrate or the ion beam is relatively moved (the substrate is scanned), whereby oxygen can be introduced to the entire surface of the base film 102.

As a gas for supplying oxygen, a gas containing O may be used; for example, an $O_2$ gas, an $N_2O$ gas, a $CO_2$ gas, a CO gas, or an $NO_2$ gas may be used. Note that the gas for supplying oxygen may contain a rare gas (e.g., Ar).

In the case where the oxygen introduction is performed by an ion implantation method, the dosage of the oxygen is preferably greater than or equal to $1\times10^{13}$ ions/cm$^2$ and less than or equal to $5\times10^{16}$ ions/cm$^2$. Note that a depth at which the oxygen is injected may be controlled by setting injection conditions as appropriate.

In the case where an oxide insulating layer is used as the base film 102, it is difficult to accurately estimate the oxygen concentration of the oxide insulating layer by a method such as secondary ion mass spectrometry (SIMS) because oxygen is one of its main components in the oxide insulating layer. That is, it is difficult to judge whether or not oxygen is intentionally added to the oxide insulating layer. The same applies to the case where excessive oxygen contained in the base film 102 is supplied to the oxide semiconductor layer in a later step.

Isotopes such as $^{17}O$ or $^{18}O$ exist in oxygen, and it is know that the existence proportions of them in nature are respectively about 0.038% and about 0.2% of the whole oxygen atoms. That is to say, it is possible to measure the concentrations of these isotopes in the base film 102 by a method such as SIMS; therefore, the oxygen concentration in the base film 102 is able to be estimated more accurately by measuring the concentration of such an isotope in some cases. Thus, the concentration of the isotope may be measured to determine whether or not oxygen is intentionally added to the base film 102. Note that the above method can also be applied to the oxide semiconductor layer 104 and the gate insulating film 106 which are formed in later steps.

The oxygen released from the base film 102 by the heat treatment performed after the formation of the oxide semiconductor film 103 has not only an effect of compensating the oxygen vacancy in the oxide semiconductor film 103 (or the oxide semiconductor layer 104) but also an effect of reducing the interface state density between the base film 102 and the oxide semiconductor film 103 (or the oxide semiconductor layer 104). Therefore, carrier trapping at the interface between the oxide semiconductor layer and the base insulating layer due to the operation of a transistor, or the like can be suppressed, and thus, a transistor having high reliability can be obtained.

Although in the above description, the oxygen-introducing treatment is performed on the base film 102 after the dehydration treatment or dehydrogenation treatment is performed thereon, the oxygen-introducing treatment may be performed before the dehydration treatment or dehydrogenation treatment. By performing the oxygen-introducing treatment on the base film 102 before the dehydration treatment or dehydrogenation treatment, distortion is caused in the crystal structure of the base film 102, so that a bond between a constituent element (e.g., silicon) and hydrogen or a bond between the element and a hydroxyl group is cut and the hydrogen or the hydroxyl group reacts with the introduced oxygen to generate water. Accordingly, the dehydration treatment or dehydrogenation treatment is performed on the base film 102 after the oxygen-introducing treatment, whereby the hydrogen or hydroxyl group contained in the base film 102 can be easily released as water. In addition, a temperature of the dehydration treatment or dehydrogenation treatment or the process time can be reduced.

One or both of the oxygen-introducing treatment and the dehydration treatment (or dehydrogenation treatment) may be performed plural times. For example, when first oxygen-introducing treatment, dehydration treatment (or dehydrogenation treatment) and second oxygen-introducing treatment are sequentially performed, i.e., oxygen-introducing treatment is performed twice, a larger amount of oxygen can be introduced to the crystal structure by the second oxygen-introducing treatment because distortion is caused in the crystal structure by the first oxygen-introducing treatment. As a result, the released amount of oxygen at the time of performing the heat treatment on the base film 102 can be increased.

Next, the oxide semiconductor film 103 is deposited over the base film 102 by a physical vapor deposition (PVD) method such as a vacuum evaporation method or a sputtering method or a chemical vapor deposition (CVD) method such as a plasma CVD method (see FIG. 3B).

An oxide semiconductor used for the oxide semiconductor film 103 contains at least indium (In). In particular, In and zinc (Zn) are preferably contained. In addition, as a stabilizer for reducing the variation in electric characteristics of a transistor using the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide, tin oxide, zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=1:3:2 (=1/6:1/2:1/3), or In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used as the oxide semiconductor containing indium depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \le r^2$, and r may be 0.05, for example. For example, r may be 0.05. The same applies to other oxides.

In order to reduce oxygen vacancy in the oxide semiconductor film 103 as much as possible, it is preferable that the oxide semiconductor film 103 is deposited in a deposition atmosphere in which an oxygen gas accounts for a large proportion; therefore, it is preferable to use a sputtering apparatus into which oxygen can be introduced and in which the gas flow rate can be adjusted. Further, 90% or more of the gas introduced into a deposition chamber of the sputtering apparatus is an oxygen gas, and in the case where another gas is used in addition to the oxygen gas, a rare gas is preferably used. Further, it is more preferable that the gas introduced into the deposition chamber is only an oxygen gas and the percentage of an oxygen gas in the deposition atmosphere is as closer to 100% as possible.

In the deposition of the oxide semiconductor film 103 using a sputtering apparatus, any one of a variety of targets having the above compositions may be used as a target. For example, an oxide target with an atomic ratio where In:Ga:Zn=1:1:1, an oxide target with an atomic ratio where In:Ga:Zn=3:1:2, or an oxide target with an atomic ratio where In:Ga:Zn=2:1:3 can be used. Note that the relative density of the target is 90% to 100%, preferably 95% to 99.9%. The use of the target with high relative density enables the formed oxide semiconductor film 103 to be a dense film.

It is preferable that the gas used for the deposition of the oxide semiconductor film 103 does not contain an impurity such as water, hydrogen, a hydroxyl group, or hydride. Further, it is preferable to use a gas having a purity greater than or equal to 6N, preferably greater than or equal to 7N (i.e., the impurity concentration in the gas is less than or equal to 1 ppm, preferably less than or equal to 0.1 ppm).

When the oxide semiconductor film 103 contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the hydrogen concentration in the oxide semiconductor film 103 is lower than $5 \times 10^{18}$ atoms/cm$^3$, preferably lower than or equal to $1 \times 10^{18}$ atoms/cm$^3$, more preferably lower than or equal to $5 \times 10^{17}$ atoms/cm$^3$, still more preferably lower than or equal to $1 \times 10^{16}$ atoms/cm$^3$. Note that the concentration of hydrogen in the oxide semiconductor film is measured by secondary ion mass spectrometry (SIMS).

Further, in the deposition of the oxide semiconductor film 103, in order to remove moisture (including water, water vapor, hydrogen, a hydroxyl group, or hydride) in the deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water (H$_2$O) (more preferably, also a compound containing a carbon atom), and the like are removed, whereby the concentration of an impurity such as hydrogen or moisture in the oxide semiconductor film 103 formed in the deposition chamber can be reduced.

When the oxide semiconductor film 103 contains an alkali metal or an alkaline earth metal, the alkali metal or the alkaline earth metal and an oxide semiconductor are bonded to each other, so that carriers are generated in some cases, which causes an increase in the off-state current of the transistor. Accordingly, it is desirable that the concentration of an alkali metal or an alkaline earth metal in the oxide semiconductor film 103 be lower than or equal to $1 \times 10^{18}$ atoms/cm$^3$, preferably lower than or equal to $2 \times 10^{16}$ atoms/cm$^3$.

In the case where the CAAC-OS film is deposited as the oxide semiconductor film 103, any of the following three methods may be employed. The first method is the one in which the oxide semiconductor film 103 is deposited at a temperature higher than or equal to 200° C. and lower than or equal to 450° C., so that the oxide semiconductor film 103 serves as the CAAC-OS film. The second method is the one in which the oxide semiconductor film 103 is deposited and then subjected to heat treatment at a temperature higher than or equal to 200° C. and lower than or equal to 700° C., so that the oxide semiconductor film 103 serves as the CAAC-OS film. The third method is the one in which a first oxide semiconductor film with a small thickness is deposited and heat treatment is performed on the first oxide semiconductor film at a temperature higher than or equal to 200° C. and lower than or equal to 700° C., so that the first oxide semiconductor film serves as a CAAC-OS film; then, a second oxide semiconductor film is deposited over the first oxide semiconductor film using a crystal in the first oxide semiconductor film as a seed crystal, whereby the CAAC-OS film is obtained.

The thickness (the length in the z-axis direction) of the oxide semiconductor film 103 needs to be changed in accordance with the channel width (the length of the thick arrow N in FIG. 1A) of the channel formation region 104b to be formed in a later step. Specifically, the thickness (the length in the z-axis direction) of the oxide semiconductor film 103 is preferably greater than or equal to twice the designed value of the channel width direction. Accordingly, an effect of reducing the contact resistance between the low-resistance region 104a and the electrode 114 which are formed in later steps can be enhanced effectively.

Note that before the formation of the oxide semiconductor film 103, treatment (also referred to as reverse sputtering treatment) in which an argon gas is introduced and plasma is generated to remove powdery substances (also referred to as particles or dust) or an organic substance attached on the surface of the base film 102 is preferably performed. Note that instead of argon, a gas of nitrogen, helium, oxygen or the like may be used.

Next, a mask 105 is formed over the oxide semiconductor film 103 by a photolithography method, a printing method, an ink-jet method, or the like, and part of the oxide semiconductor film 103 is selectively removed using the mask to form the oxide semiconductor layer 104 (see FIG. 3C).

A length in the short-side direction (the dashed dotted line Y1-Y2 direction) of the oxide semiconductor layer 104 formed by processing the oxide semiconductor film 103 is very short as illustrated in FIGS. 1A to 1C; therefore, the oxide semiconductor film 103 is preferably processed by a dry etching method such as an ion beam etching method or a reactive ion etching (RIE) method, which is a highly anisotropic etching method. Alternatively, a beam etching method using neutral particles may be employed.

Note that a resist mask and a hard mask can be used as the 105. In particular, in the case where the thickness of the oxide semiconductor layer 104 (the length of a thick arrow F in FIG. 3C) is larger than the length in the Y1-Y2 direction (the length of a thick arrow E in FIG. 3C) of the oxide semiconductor layer 104, there is a possibility that the resist mask is removed in the processing of the oxide semiconductor film 103 when only the resist mask is formed for the processing, so that the processing of the oxide semiconductor film 103 might not reach the bottom of the oxide semiconductor film 103. In this case, after a film to serve as a hard mask is formed over the oxide semiconductor film 103, a resist mask is formed over the film, and then a hard mask is formed using the resist mask. Then, the oxide semiconductor film 103 is processed using the hard mask (as well as the resist mask when the resist mask remains). Note that a silicon oxide film, a silicon nitride film, a tungsten film, or the like can be used for the hard mask.

Although not illustrated in FIG. 3C, the mask 105 is removed by treatment with a chemical solution or etching treatment after the oxide semiconductor layer 104 is formed.

Next, the gate insulating film 106 and a conductive film 107 are deposited over the base film 102 and the oxide semiconductor layer 104 using a physical vapor deposition (PVD) method such as a vacuum evaporation method or a sputtering method or a chemical vapor deposition (CVD) method such as a plasma CVD method (see FIG. 4A).

In order that the transistor 120 has high performance (e.g., in order to reduce the transistor 120 in size or reduce power consumption of the transistor 120), it is necessary that the gate insulating film 106 is thinner. Thus, if coverage with the gate insulating film 106 is bad, a film breakage of the gate insulating film 106 occurs in some cases. Therefore, a CVD method, which provides relatively good film coverage, is preferably used for forming the gate insulating film 106. In addition, a method for forming a stack at an atomic level, such as an atomic layer deposition (ALD) method may be used. A film formed by an ALD method is excellent in step coverage, thickness controllability, and thickness uniformity; therefore, an ALD method is suitable for forming a film covering the thin-plate-shaped oxide semiconductor layer 104 as illustrated in FIG. 4A.

As the gate insulating film 106, an oxide semiconductor film having a sufficient withstand voltage and a sufficient insulating property is preferably used. Therefore, the gate insulating film 106 may be formed by the above deposition method to have a single-layer structure or a stacked-layer structure of a silicon oxide film, a silicon oxynitride film, a silicon nitride film, a silicon nitride oxide film, an aluminum oxide film, an aluminum nitride film, an aluminum oxynitride film, an aluminum nitride oxide film, a gallium oxide film, an yttrium oxide film, a lanthanum oxide film, or the like. A high-k material film such as a hafnium oxide film, a hafnium silicate film ($HfSi_xO_y$ (x>0, y>0)), a hafnium silicate film to which nitrogen is added ($HfSiO_xN_y$ (x>0, y>0)), or a hafnium aluminate film ($HfAl_xO_y$ (x>0, y>0)), may be used as at least part of the gate insulating film 106. Thus, gate leakage current can be reduced.

The thickness of the gate insulating film 106 is preferably greater than or equal to 1 nm and less than or equal to 300 nm, more preferably greater than or equal to 5 nm and less than or equal to 50 nm. Leakage due to a tunnel current is found to be increased with a thickness of the gate insulating film of less than or equal to 5 nm.

As the gate insulating film 106, an oxide insulating film capable of releasing part of oxygen by heat treatment and supplying the oxygen to the oxide semiconductor layer 104 to compensate the oxygen vacancy in the oxide semiconductor layer 104 may be formed like in the case of the base film 102. The description of the base film 102 can be referred to for the details of the heat treatment. Note that there is no particular limitation on the timing when the heat treatment (dehydration treatment (or dehydrogenation treatment)) is performed on the gate insulating film 106 as long as it is after the gate insulating film 106 is deposited.

In addition, oxygen-introducing treatment may be performed on the gate insulating film 106 in a manner similar to that of the base film 102. It is necessary that insulation between the channel formation region 104b and the gate electrode 108 which are formed in later steps is ensured by the gate insulating film 106; therefore, the oxygen-introducing treatment is preferably performed so that damage to the gate insulating film 106 is small. Therefore, in the case where the thickness of the gate insulating film 106 is less than or equal to 50 nm, oxygen plasma treatment may be performed as the oxygen-introducing treatment. Note that in the case where a method which causes less damage to the gate insulating film 106 (e.g., oxygen plasma treatment) is performed as the oxygen-introducing treatment, one or both of the oxygen-introducing treatment and the dehydration treatment (or dehydrogenation treatment) may be performed on the gate insulating film 106 plural times in a manner similar to that of the base film 102.

The conductive film 107 may be formed by depositing a metal material such as molybdenum (Mo), titanium (Ti), tantalum (Ta), tungsten (W), aluminum (Al), copper (Cu), chromium (Cr), neodymium (Nd), or scandium (Sc); or an alloy material mainly containing any of these materials by a physical vapor deposition (PVD) method such as a vacuum evaporation method or a sputtering method or a chemical vapor deposition (CVD) method such as a plasma CVD method.

The conductive film 107 may have a single-layer structure or a stacked-layer structure of two or more layers. For example, a single-layer structure of aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which Cu is stacked over a Cu—Mg—Al alloy, a two-layer structure in which copper is stacked over titanium nitride, a three-layer structure in which titanium nitride, copper, and tungsten are stacked in this order, a three-layer structure in which titanium nitride, copper and molybdenum are stacked in this order, and the like can be given.

Alternatively, a conductive metal oxide material may be used. As the conductive metal oxide material, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials containing silicon, silicon oxide, titanium oxide, or tungsten oxide can be used. The conductive film 107 may be formed with a single layer or a stack of layers using one or more of the above materials.

As the conductive film 107, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher; thus, the threshold voltage of the electric characteristics of the transistor can be positive when any of these films is in contact with the gate insulating film 106. Accordingly, what is called a normally-off switching element can be obtained.

Next, a resist mask is formed over part of the conductive film 107 by a photolithography method, a printing method, an ink-jet method, or the like, and part of the conductive film 107 is selectively removed by a dry etching method or a wet etching method using the mask to form the gate electrode 108 (including a wiring formed using the same layer) (see FIG. 4B).

Next, impurity ions 109 by which the conductivity of the oxide semiconductor layer 104 is changed are introduced to the oxide semiconductor layer 104 by an ion doping method or an ion implantation method. At this time, the gate electrode 108 functions as a mask and thus the low-resistance regions 104a to which the impurity ions 109 are added and the channel formation region 104b sandwiched between the pair of low-resistance regions 104a are formed in the oxide semiconductor layer 104 in a self-aligning manner (see FIG. 5A). Note that since the oxide semiconductor layer 104 has a thin-plate shape as illustrated in FIGS. 1A to 1C, it is difficult to introduce the impurity ions 109 to the vicinity of the bottom (a surface in contact with the base film 102) of the oxide semiconductor layer 104 when the impurity ions 109 are introduced from a direction which is substantially perpendicular to the surface of the oxide semiconductor layer 104 (i.e., in the z-axis direction in FIGS. 1A to 1C). Accordingly, the ion-introducing treatment is preferably performed in such a manner that the impurity ions 109 are injected from an oblique direction as illustrated in the right drawing of FIG. 5A (such injection is also referred to as oblique injection or oblique ion injection). Alternatively, the ion-introducing treatment may be performed in such a manner that oblique injection is performed while the substrate 100 is rotated about the center of the plane of the substrate 100 as an axis (such injection is also referred to as rotation injection or rotation ion injection). Note that although the impurity ions 109 seem to be introduced to the channel formation region 104b which is illustrated in the cross section along the dashed-dotted line Y1-Y2 in the right drawing of FIG. 5A, the illustration is made for easy conceptual understanding of the oblique injection of the impurity ions 109 to the oxide semiconductor layer 104. Therefore, actually, the channel formation region 104b illustrated in the cross-section along the dashed-dotted line Y1-Y2 is covered with the gate electrode 108 with the gate insulating film 106 positioned therebetween, and thus, unlike in the drawing, the impurity ions are not introduced to the channel formation region 104b.

Figure 2A:
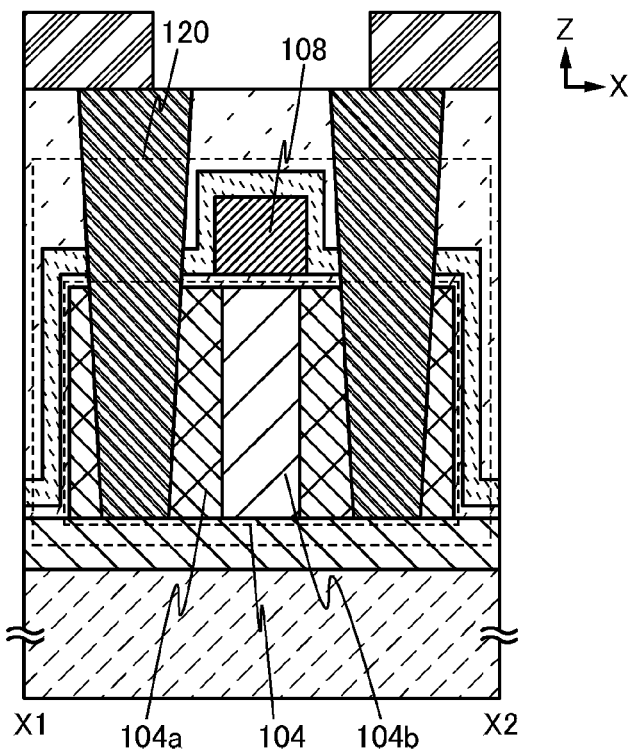
FIGS. 2A to 2C are cross-sectional views each illustrating one embodiment of a semiconductor device.
Figure 2B:
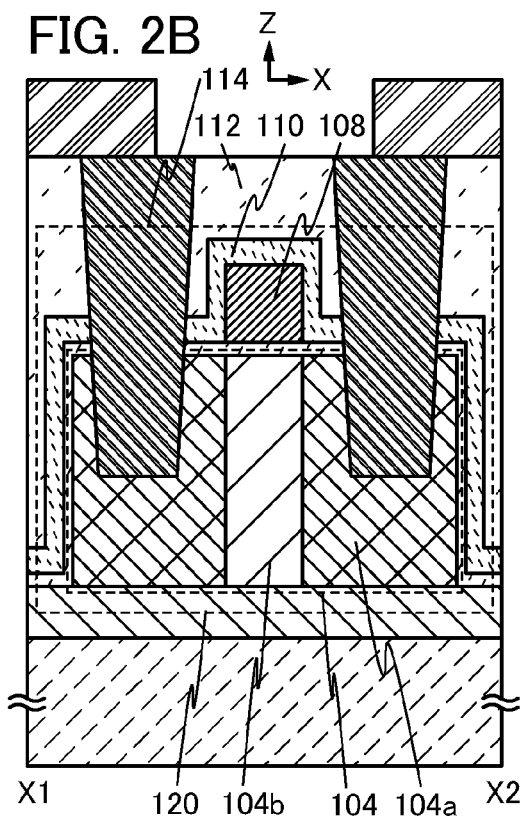
Figure 2C:
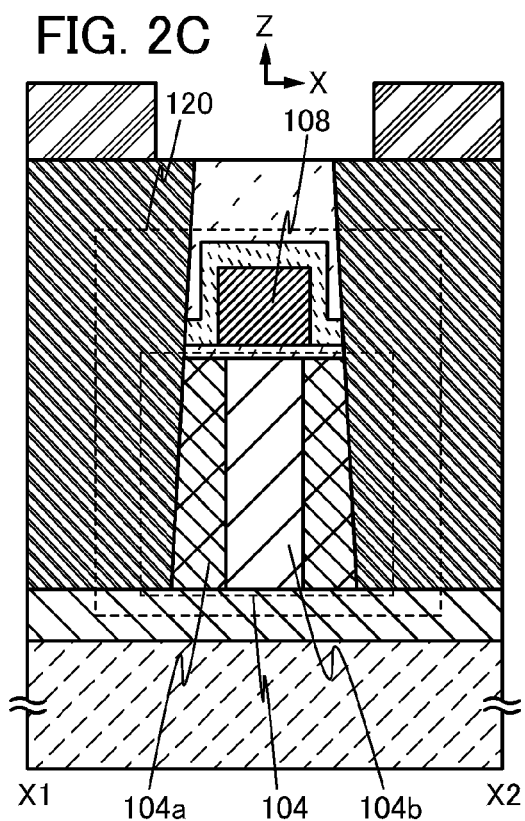

Note that in the case where the low-resistance regions 104a and the channel formation region 104b are formed using the gate electrode 108 as the mask as described above, the impurity ions 109 may also be introduced to part of the oxide semiconductor layer 104 which overlaps with the gate electrode 108, so that a portion of the part of the oxide semiconductor layer 104 which overlaps with the gate electrode 108 can be included in the low-resistance region 104a as illustrated in FIG. 2A. In this case, the amount of the impurity ions 109 introduced to the portion is smaller than that of the impurity ions 109 introduced to part of the low-resistance regions 104a which does not overlap with the gate electrode 108; therefore, the portion functions as an electric-field-relaxing region which relaxes an electric field applied to the channel formation region. Therefore, the structure of FIG. 2A may be considered as the one in which the electric-field-relaxing region is formed between the channel formation region 104b and each of the low-resistance regions 104a. Note that the electric-field-relaxing region may have a concentration distribution of the impurity ion 109 such that the concentration of the impurity ion 109 becomes low as the distance to the channel formation region 104b is reduced.

One or more selected from the following can be used as the impurity ion 109: Group 15 elements (typified by nitrogen (N), phosphorus (P), arsenic (As), and antimony (Sb)), boron (B), aluminum (Al), argon (Ar), helium (He), neon (Ne), indium (In), fluorine (F), chlorine (CO, titanium (Ti), and zinc (Zn). Note that an ion implantation method uses a mass separator with which only necessary ion is extracted, and thus only the impurity ion 109 can be selectively added to an object by an ion implantation method. An ion implantation method is thus preferably employed, in which case the entry of impurities (e.g., hydrogen) into the oxide semiconductor layer 104 is reduced as compared to the case where the ion is added by an ion doping method. Note that the use of an ion doping method is not excluded.

Figure 5A:
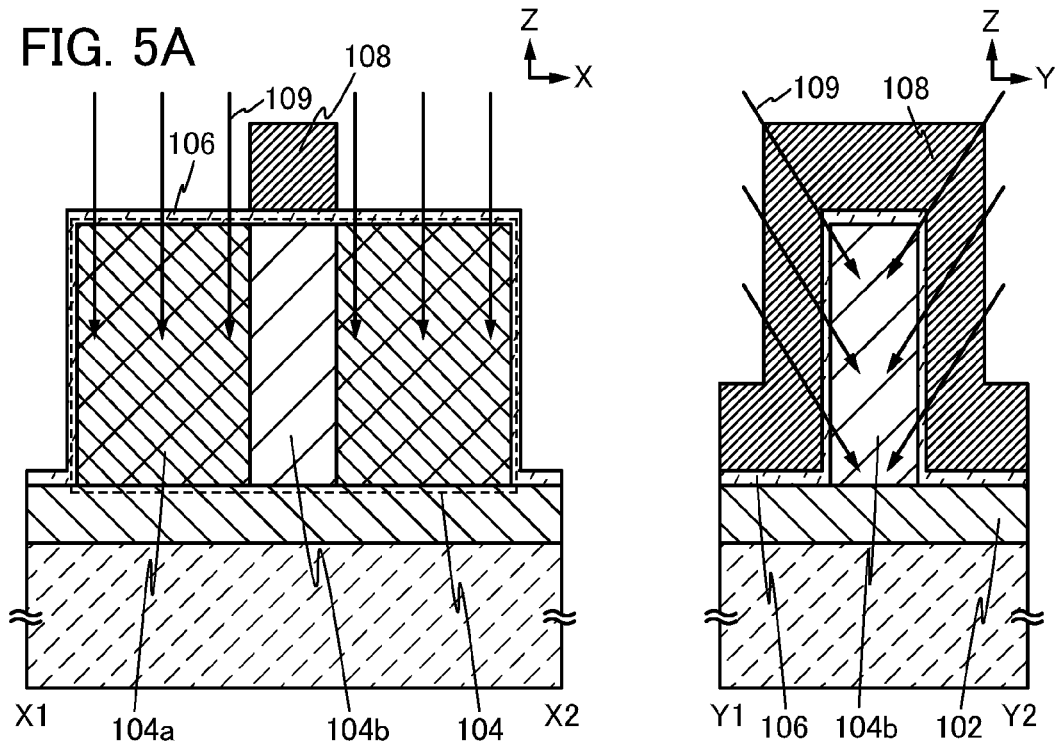
FIGS. 5A and 5B are cross-sectional views illustrating an example of a manufacturing process of a semiconductor device.
Figure 5B:
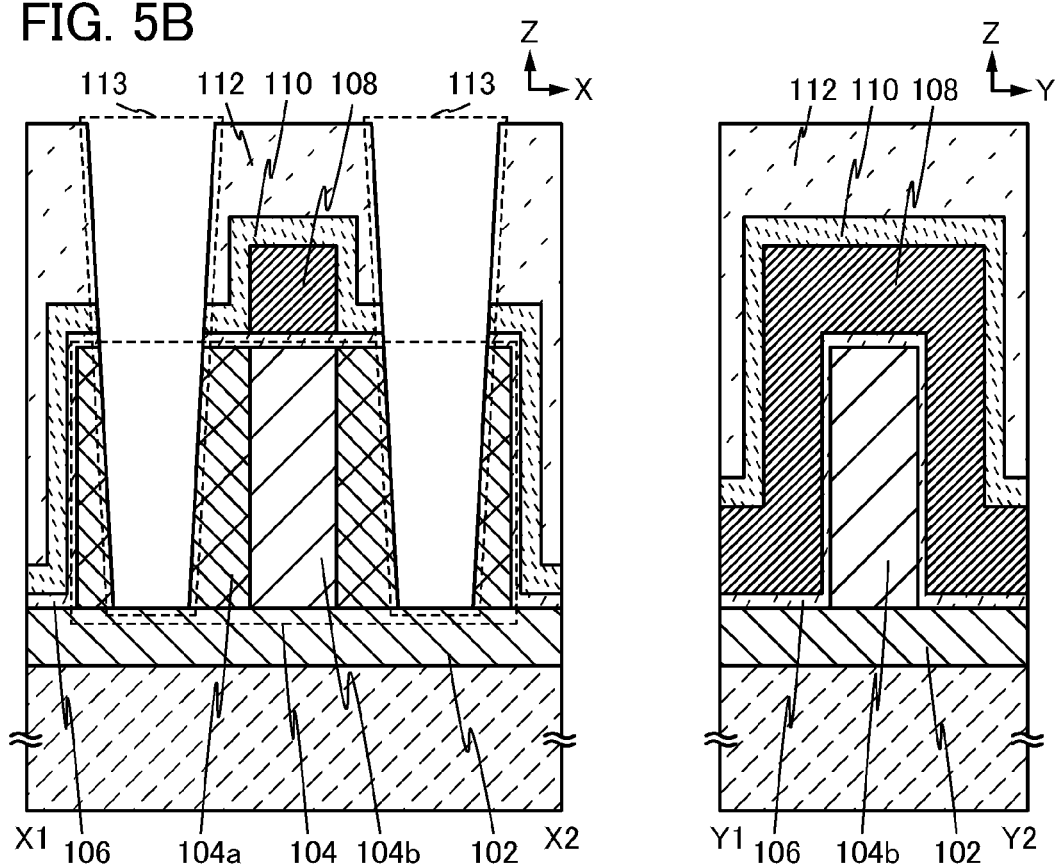

Next, the first interlayer insulating film 110 and the second interlayer insulating film 112 are provided over the gate insulating film 106 and the gate electrode 108, and then grooves 113 are formed in part of the first interlayer insulating film 110, the second interlayer insulating film 112, the gate insulating film 106, and the low-resistance regions 104a (see FIG. 5B).

In the case where an inorganic material film is used for the first interlayer insulating film 110 or the second interlayer insulating film 112, the inorganic material film may be deposited using the same material and method as those of the gate insulating film 106.

In the case where an organic material film is deposited as the first interlayer insulating film 110 or the second interlayer insulating film 112, the organic material film may be formed in such a manner that a material having an insulating property is applied by a spin coating method, a printing method, a dispensing method, an ink-jet method, or the like, and cure treatment (e.g., heat treatment or light irradiation treatment) is performed depending on the applied material. As the material having an insulating property, for example, an organic resin such as an acrylic resin, a polyimide resin, a polyamide resin, a polyamide-imide resin, or an epoxy resin can be used. In addition to such resin materials, it is also possible to use a low-dielectric constant material (low-k material), a siloxane-based resin, phosphosilicate glass (PSG), borophosphosilicate glass (BPSG), or the like. Note that a plurality of insulating films formed of any of these materials may be stacked. The planarizing insulating film in many cases contains a relatively large number of impurities such as moisture and therefore is preferably formed over the above-described insulating film (e.g., aluminum oxide or a stacked-layer film containing aluminum oxide).

As the first interlayer insulating film 110, an aluminum oxide film may be formed by a sputtering method. An aluminum oxide film is highly effective in preventing the entry of impurities such as moisture and hydrogen from the outside. Therefore, when an aluminum oxide film or a stack including an aluminum oxide film is formed as the first interlayer insulating film 110, the entry of impurities such as moisture and hydrogen to the oxide semiconductor layer 104 can be prevented. Note that the effect of preventing the entry of the impurities such as moisture and hydrogen to the oxide semiconductor layer 104 is effectively enhanced when the density of the aluminum oxide film is set to higher than or equal to 3.2 g/cm$^3$, preferably higher than or equal to 3.5 g/cm$^3$.

In addition, in the case where an oxide insulating film from which part of oxygen can be released by heat treatment is used as the gate insulating film 106 and dehydration treatment (or dehydrogenation treatment) is performed after the formation of the first interlayer insulating film 110, when an aluminum oxide film is used as the first interlayer insulating film as described above, the oxygen released from the gate insulating film 106 can be prevented from being diffused to the second interlayer insulating film 112 side, so that oxygen can be efficiently supplied to the oxide semiconductor layer 104.

Note that in the case where a film which is highly effective in preventing the entry of the impurities such as moisture and hydrogen is used as each of the base film 102 and the first interlayer insulating film 110, a structure illustrated in FIGS. 1A to 1C, in which the film covers the periphery of the whole oxide semiconductor layer 104, is formed. With such a structure, oxygen can be extremely effectively supplied to the oxide semiconductor layer 104 in the dehydration treatment (or the dehydrogenation treatment) after the formation of the first interlayer insulating film 110.

Although there is no particular limitation on the thickness of the first interlayer insulating film 110, the thickness of the first interlayer insulating film 110 is preferably greater than or equal to 100 nm and less than or equal to 500 nm in view of the above impurity-preventing effect and the cycle time of the transistor 120.

The second interlayer insulating film 112 may be formed in such a manner that a photosensitive polyimide resin is applied by a spin coating method and cure treatment is performed. An organic material film of a photosensitive polyimide resin or the like is formed over the first interlayer insulating film 110, whereby a surface can be planarized. Accordingly, another semiconductor element can be easily formed over the transistor 120. Therefore, in particular, such formation of the organic material film is preferable to form of a stacked-layer semiconductor device in which semiconductor elements are provided in different levels.

Although there is no particular limitation on the thickness of the second interlayer insulating film 112, the thickness of the second interlayer insulating film 112 is preferably greater than or equal to 100 nm and less than or equal to 3000 nm in view of an effect of planarization and time and conditions for curing the resin.

The grooves 113 are formed by a dry etching method or a wet etching method. Note that the bottoms of the grooves 113 are located at the surface of the base film 102 in FIG. 5B; however, such an opening state is not necessarily provided. For example, the bottoms of the grooves 113 may be located inside the low-resistance regions 104a as illustrated in FIG. 2B, or may be located inside the base film 102.

It is preferable that the grooves 113 are formed to cross the low-resistance regions 104a in the channel width direction (Y-axis direction) when the oxide semiconductor layer 104 is seen from a direction perpendicular to the base film 102 as illustrated in FIG. 1A; however, this structure is not necessarily employed.

Next, a conductive film is deposited over the second interlayer insulating film 112 and subjected to removal treatment to form the pair of electrodes 114 between which the gate electrode 108 is positioned in the grooves 113 (see FIG. 6A). Through the above process, it is possible to form the transistor 120 which includes the oxide semiconductor layer 104 including the channel formation region 104b and the pair of low-resistance regions 104a between which the channel formation region 104b is positioned; the gate insulating film 106 covering the oxide semiconductor layer 104; the gate electrode 108 covering at least the channel formation region 104b with the gate insulating film 106 positioned therebetween; and the electrodes 114 electrically connected to the low-resistance regions 104a. Note that the pair of electrodes 114 is electrically connected to the low-resistance regions 104a and serves as a source electrode and a drain electrode.

As the conductive film used for the electrodes 114, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. Alternatively, the electrodes 114 may have a structure in which a film of a high-melting-point metal such as titanium, molybdenum, or tungsten, or a nitride film of any of these metals (a titanium nitride film, a molybdenum nitride film, or a tungsten nitride film) is stacked on either or both of the bottom surface and the top surface of a metal film of aluminum, copper, or the like. The conductive film used for the electrodes 114 may be formed of conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO) can be used. The conductive film used for the source electrode and the drain electrode can be formed using any of the above materials to have a single layer or a stacked structure. There is no particular limitation on the method for forming the layer containing a conductive material, and a variety of film formation methods such as an evaporation method, a CVD method, a sputtering method, or a spin coating method can be employed.

As the removal treatment performed on the conductive film, chemical mechanical polishing (CMP), a dry etching method, or the like may be used like in the case of the planarization treatment.

After that, a conductive film is deposited over the second interlayer insulating film 112 and the electrodes 114. Then, a mask is formed over the conductive film by a photolithography method, a printing method, an ink-jet method, or the like, and part of the conductive film is selectively removed using the mask to form the wirings 116 (see FIG. 6B). For example, the wirings 116 function as leading wirings which electrically connect the transistor 120 and another transistor to each other. Note that a material which is similar to that of the electrodes 114 can be used for the conductive film used for the wirings 116.

Through the above process, the structure illustrated in FIGS. 1A to 1C can be formed.

(Embodiment 2)

In this embodiment, the structure of a semiconductor element whose structure is different from that described in Embodiment 1 and a method for manufacturing the semiconductor element will be described with reference to FIGS. 7A to 7C, FIGS. 8A and 8B, FIGS. 9A and 9B, FIGS. 10A and 10B, FIG. 11, FIGS. 12A and 12B, and FIGS. 13A and 13B.

<Structural Example of Semiconductor Element>

FIGS. 7A to 7C illustrate an example of a plan view and cross-sectional views of a top-gate transistor as an example of a semiconductor element. FIG. 7A is a plan view. FIG. 7B is a cross-sectional view taken along dashed-dotted line X1-X2 in FIG. 7A. FIG. 7C is a cross-sectional view taken along dashed-dotted line Y1-Y2 in FIG. 7A. Note that in FIG. 7A, some components (e.g., the substrate 100) of a transistor 720 are not illustrated to avoid complexity.

The transistor 720 in this embodiment is different from the transistor described in Embodiment 1 in that the transistor 720 includes a structure body 710 including an oxide semiconductor layer 708 and a pair of electrodes 706 between which the oxide semiconductor layer 708 is positioned and surfaces of which are at the same level as a surface of the oxide semiconductor layer 708.

The transistor 720 illustrated in FIGS. 7A to 7C includes the base film 102 provided over the substrate 100; the structure body 710 which is provided over the base film 102 and includes the electrodes 706 and the oxide semiconductor layer 708; the gate insulating film 106 which covers the structure body 710; and the gate electrode 108 which is located over the gate insulating film 106 and covers a top surface and a side surface of the oxide semiconductor layer 708 with the gate insulating film 106 positioned therebetween. In addition, the first interlayer insulating film 110 and the second interlayer insulating film 112 which cover the gate insulating film 106 and the gate electrode 108 are provided over the transistor 720. The wirings 116 are electrically connected to the electrodes 706 through grooves provided in the gate insulating film 106, the first interlayer insulating film 110, and the second interlayer insulating film 112. Although not illustrated, the transistor 720 is electrically connected to another semiconductor element (e.g., a transistor) through the wiring 116.

As illustrated in FIG. 7B, the structure body 710 includes the pair of electrodes 706 and the oxide semiconductor layer 708 sandwiched between the pair of electrodes 706. The oxide semiconductor layer 708 functions as the channel formation region 104b of Embodiment 1, and the pair of electrodes 706 is provided directly in contact with the oxide semiconductor layer 708. Therefore, unlike in Embodiment 1, a region serving as a resistive component (which corresponds to the low-resistance regions 104a in Embodiment 1) does not exist between the channel formation region and the electrodes, and thus an adverse effect on the electrical characteristics of the transistor (e.g., a reduction in the on-state current) can be reduced. In addition, the side surface of the electrodes 706 and the side surface of the oxide semiconductor layer 708 that face to each other are entirely in contact with each other, i.e., the electrodes 706 and the oxide semiconductor layer 708 are electrically connected to each other in large areas, so that it is possible to effectively prevent a reduction in on-state current and an increase in variations in electrical characteristics due to an increase in contact resistance.

In addition, in the case where the structure body 710 including the oxide semiconductor layer 708 has a thin-plate shape and voltage is applied to the gate electrode 108, a channel portion is formed in U-shape in the oxide semiconductor layer 708 in the vicinity of the interface with the gate insulating film 106 as shown by a thick dotted line Z1-Z2 in FIG. 7C; therefore, a change in channel width (the thick arrow N in FIG. 7A) which is caused in the processing of the structure body 710 has a relatively small influence on variations in the electrical characteristics of the transistor 720.

The electrodes 706 in the structure body 710 are electrically connected to the wirings 116 through the grooves provided in the gate insulating film 106, the first interlayer insulating film 110, and the second interlayer insulating film 112. Note that the wirings 116 are in contact with surfaces of the electrodes 706 which are exposed in the grooves in FIG. 7B; however, the grooves may reach the inside of the electrodes 706 and the wirings 116 may be in contact with the inside of the electrodes 706, for example. This structure increases areas where the electrodes 706 are in contact with the wirings 116, so that a reduction in on-state current and an increase in variations in the electrical characteristics due to an increase in contact resistance can be effectively prevented.

The length of the oxide semiconductor layer 708 in the channel width direction (i.e., the length of the thick arrow N of FIG. 7A in the Y-axis direction) is preferably greater than or equal to 1 nm and less than or equal to 60 nm when the structure body 710 is seen from the direction perpendicular to the surface of the base film 102. The length of the portion indicated with the thick arrow N is less than or equal to 60 nm and the gate electrode 108 covers the top surface and the side surface of the oxide semiconductor layer 708 with the gate insulating film 106 positioned therebetween, whereby the oxide semiconductor layer 708 is fully depleted or substantially fully depleted. Accordingly, the transistor 720 can have characteristics such as a small substrate-floating effect and favorable subthreshold characteristics. The structure body 710 is formed in thin-plate shape (which is also represented as a thin piece shape), and thus there is a problem in that processing becomes difficult when the structure body 710 is too thin. Therefore, it is preferable that the length of the portion is greater than or equal to 1 nm.

The effect of reducing contact resistance is enhanced as the length of a side which is an interface between the oxide semiconductor layer 708 and the electrode 706 (the length of a thick arrow Q in FIG. 7B) becomes longer than the length of a side which is an interface between the oxide semiconductor layer 708 and the base film 102 (the length of a thick arrow R in FIG. 7B) in the cross section of the oxide semiconductor layer 708 taken along the longitudinal direction of the structure body 710 as illustrated in FIG. 7B. Specifically, the length of the side which is the interface between the oxide semiconductor layer 708 and the electrode 706 (also referred to as the thickness of the oxide semiconductor layer 708) is preferably greater than or equal to twice the length of the side which is the interface between the oxide semiconductor layer 708 and the base film 102 (also referred to as the length of the oxide semiconductor layer 708 in the channel length direction).

As illustrated in FIGS. 7B and 7C, the gate electrode 108 is provided over the structure body 710 to cover the side surface and the top surface of the oxide semiconductor layer 708 with the gate insulating film 106 positioned therebetween.

Although edge portions of the gate electrode 108 overlap with edge portions of the oxide semiconductor layer 708 in FIGS. 7A to 7C, this structure is not necessarily employed and, for example, part of the gate electrode 108 may overlap with the electrode 706.

In addition, although the gate electrode 108 has a constant length in the dashed-dotted line X1-X2 direction as illustrated in FIG. 7A, the gate electrode 108 does not necessarily have the constant length in the dashed-dotted line X1-X2 direction. For example, in the case where the gate electrode 108 is electrically connected to another semiconductor element (e.g., a transistor), part of the gate electrode 108 also functions as a wiring. Therefore, in such a case, the line width of part of the gate electrode 108 which does not overlap with the structure body 710 is increased, whereby wiring resistance can be reduced.

<Method for Manufacturing Transistor 720>

An example of a manufacturing process of the transistor 720 illustrated in FIGS. 7A to 7C is described with reference to FIGS. 8A and 8B, FIGS. 9A and 9B, FIGS. 10A and 10B, and FIG. 11.

First, the substrate 100 having an insulating surface is prepared. Then, the base film 102 is formed over the substrate 100 and a conductive film 702 is deposited over the base film 102 (see FIG. 8A). Embodiment 1 can be referred to for a material of the substrate 100, a material and formation method of the base film 102, and the like.

As a material of the conductive film 702, a material which is capable of withstanding heat treatment performed in the manufacturing process of the transistor 720 is used. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Alternatively, the conductive film 702 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials to which silicon oxide is added can be used.

Next, a mask is formed over the conductive film 702 by a photolithography method, a printing method, an ink-jet method, or the like, and part of the conductive film 702 is selectively removed using the mask to form an opening 703 (see FIG. 8B).

Next, an oxide semiconductor film 704 is deposited over the base film 102 and the conductive film 702 and subjected to removal treatment, so that at least part of the oxide semiconductor film 704 is removed to expose the conductive film 702 (see FIG. 9A). Note that the oxide semiconductor film 704 can be formed using a material and a formation method which are similar to those of the oxide semiconductor layer 104 described in Embodiment 1.

How much thickness (length in the Z-axis direction) the conductive film 702 and the oxide semiconductor film 704 have after the removal treatment needs to be determined on the basis of the channel width (the length of the thick arrow N in FIG. 7A) of the oxide semiconductor layer 708 formed later. Specifically, the thickness of the conductive film 702 and the oxide semiconductor film 704 (the length in the Z-axis direction) is preferably greater than or equal to twice a designed value of the channel width. The use of such a structure can effectively enhance the effect of reducing the contact resistance between the electrodes 706 and the oxide semiconductor layer 708 which are formed later.

As the removal treatment performed on the oxide semiconductor film 704, chemical mechanical polishing (CMP) treatment, a dry etching method, or the like may be used in the same manner as the planarization treatment in Embodiment 1. Although a surface of the conductive film 702 and a surface of the oxide semiconductor film 704 are located at the same level in FIG. 9A, this embodiment is not limited to this state. For example, in the case where there is a different in hardness between the conductive film 702 and the oxide semiconductor film 704, when CMP treatment is further performed in the state where the conductive film 702 is exposed, a step might be formed between the surface of the conductive film 702 and the surface of the oxide semiconductor film 704 because the conductive film 702 and the oxide semiconductor film 704 are different in removal rate (polishing rate) in the CMP treatment.

Note that the CMP treatment as the removal treatment may be performed only once or plural times. When the CMP treatment is performed plural times, first polishing is preferably performed with a high polishing rate followed by final polishing with a low polishing rate. The planarity of the surface of the conductive film 702 and the planarity of the surface of the oxide semiconductor film 704 can be improved by performing polishing steps with different polishing rates in combination in this manner, so that the uniformity of the thickness of the gate insulating film 106 which is formed over the conductive film 702 and the oxide semiconductor film 704 in a later step can be increased.

Next, the mask 105 is formed over the conductive film 702 and the oxide semiconductor film 704 by a photolithography method, a printing method, an ink-jet method, or the like and part of the conductive film 702 and part of the oxide semiconductor film 704 are selectively removed using the mask, so that the structure body 710 including the electrodes 706 and the oxide semiconductor layer 708 is formed (see FIG. 9B). Although not illustrated in FIG. 9B, the mask 105 may be removed by treatment with a chemical solution or etching treatment after the structure body 710 is formed. Note that Embodiment 1 can be referred to for the mask 105.

Next, the gate insulating film 106 is formed over the base film 102 and the structure body 710, and the gate electrode 108 is formed over the gate insulating film 106. Embodiment 1 can be referred to for materials and manufacturing methods of the gate insulating film 106 and the gate electrode 108. Through the above process, the transistor 720 which includes the structure body 710 including the oxide semiconductor layer 708 and the pair of electrodes 706 between which the oxide semiconductor layer 708 is positioned; the gate insulating film 106 over the structure body 710; and the gate electrode 108 covering the oxide semiconductor layer 708 with the gate insulating film 106 positioned therebetween can be formed (see FIG. 10A).

Subsequently, the first interlayer insulating film 110 and the second interlayer insulating film 112 are provided over the gate insulating film 106 and the gate electrode 108, and then grooves 705 are formed in part of the first interlayer insulating film 110, the second interlayer insulating film 112, the gate insulating film 106 (see FIG. 10B). Note that Embodiment 1 can be referred to for materials and manufacturing methods of the first interlayer insulating film 110 and the second interlayer insulating film 112. In addition, Embodiment 1 can also be referred to for a formation method of the grooves 705.

After that, a conductive film is deposited over the second interlayer insulating film 112, and a mask is formed over the conductive film by a photolithography method, a printing method, an ink-jet method, or the like. Then, part of the conductive film is selectively removed using the mask to form the wirings 116 (see FIG. 11A). For example, the wirings 116 function as leading wirings which electrically connect the transistor 720 and another transistor to each other. Note that Embodiment 1 can be referred to for a material and manufacturing method of the wirings 116.

Although the pair of electrodes 706 between which the oxide semiconductor layer 708 is positioned are electrically connected to another semiconductor element (e.g., a transistor) via the wirings 116 which are led over the second interlayer insulating film 112 in this embodiment, one embodiment of the present invention is not limited to this structure. For example, one or both of the electrodes 706 may be directly electrically connected to another transistor (e.g., a transistor).

Through the above process, the structure illustrated in FIGS. 7A to 7C can be formed.

(Embodiment 3)

In this embodiment, a method for manufacturing the structure body 710, which is different from that described in Embodiment 2 will be described with reference to FIGS. 12A and 12B and FIGS. 13A and 13B.

<Method for Manufacturing Structure Body>

Figure 12A:
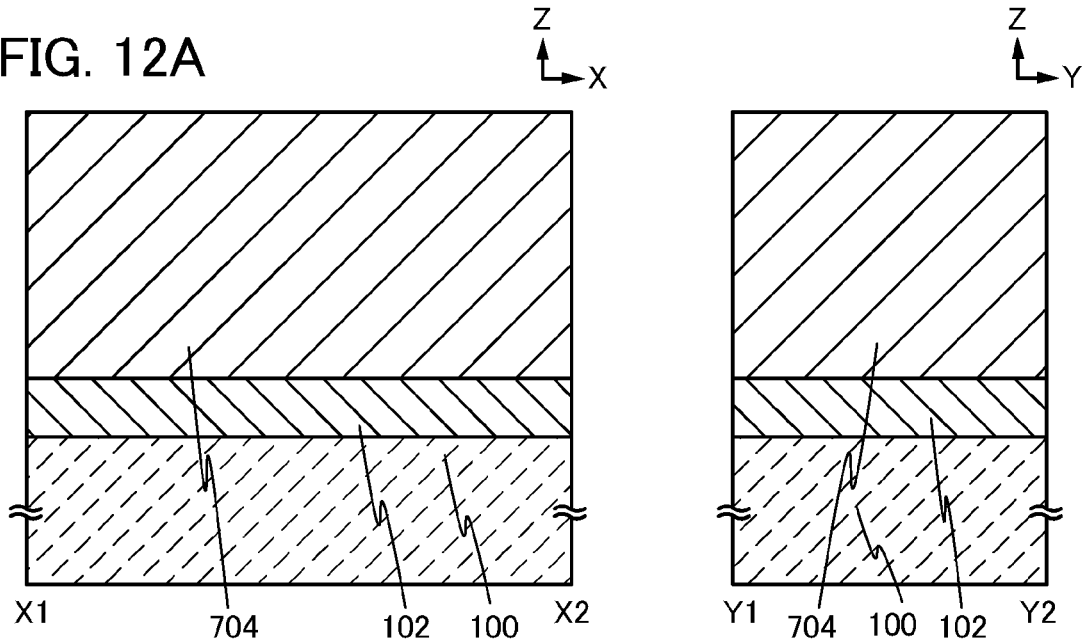
FIGS. 12A and 12B are cross-sectional views illustrating an example of a manufacturing process of a semiconductor device.

First, the oxide semiconductor film 704 is formed over the base film 102 which is formed over the substrate 100 (see FIG. 12A). Embodiment 1 can be referred to for a material and a formation method of the oxide semiconductor film 704.

Figure 12B:
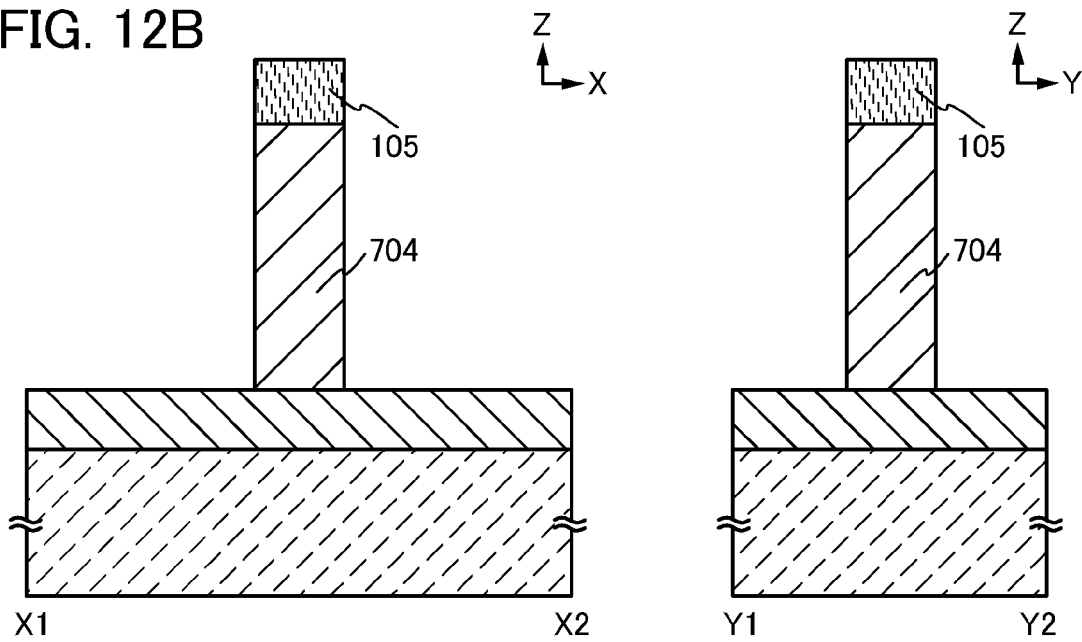

Next, the mask 105 is formed over the oxide semiconductor film 704 by a photolithography method, a printing method, an ink-jet method, or the like and part of the oxide semiconductor film 704 is selectively removed using the mask (see FIG. 12B). Embodiment 1 can be referred to for a material and a formation method of the mask 105.

Although not illustrated in FIG. 12B, the mask 105 may be removed by treatment with a chemical solution or etching treatment after the oxide semiconductor film 704 is processed.

Figure 13A:
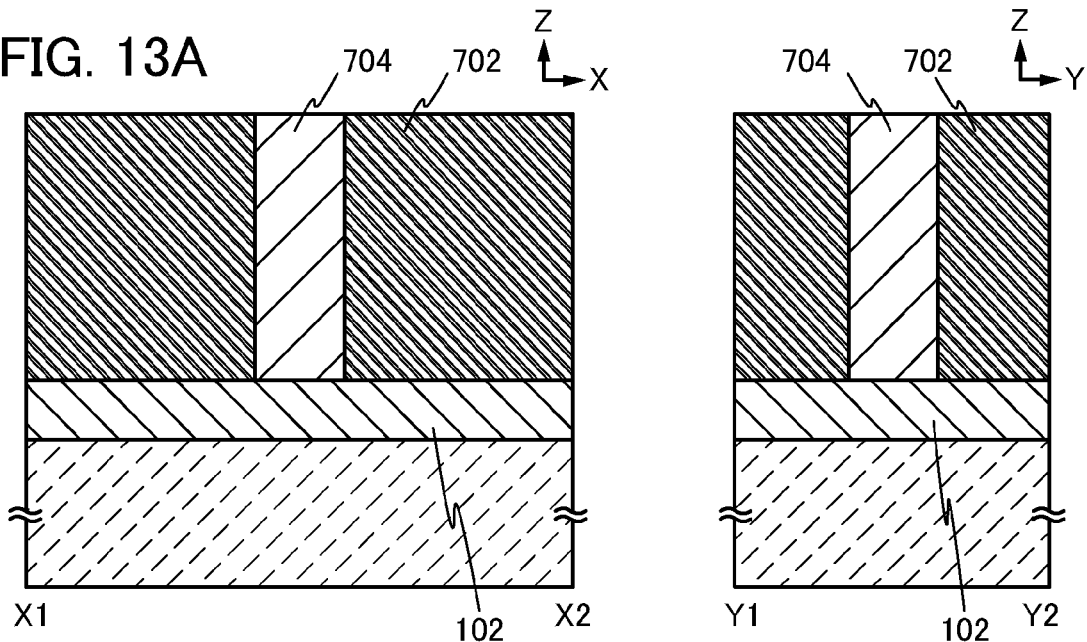
FIGS. 13A and 13B are cross-sectional views illustrating an example of a manufacturing process of a semiconductor device.

Next, the conductive film 702 is formed over the base film 102 and the oxide semiconductor film 704 and subjected to removal treatment, so that at least part of the conductive film 702 is removed to expose the oxide semiconductor film 704 (see FIG. 13A). Embodiment 2 can be referred to for a material and a formation method of the conductive film 702. In addition, Embodiment 1 can be referred to for the removal treatment of the conductive film 702.

Figure 13B:
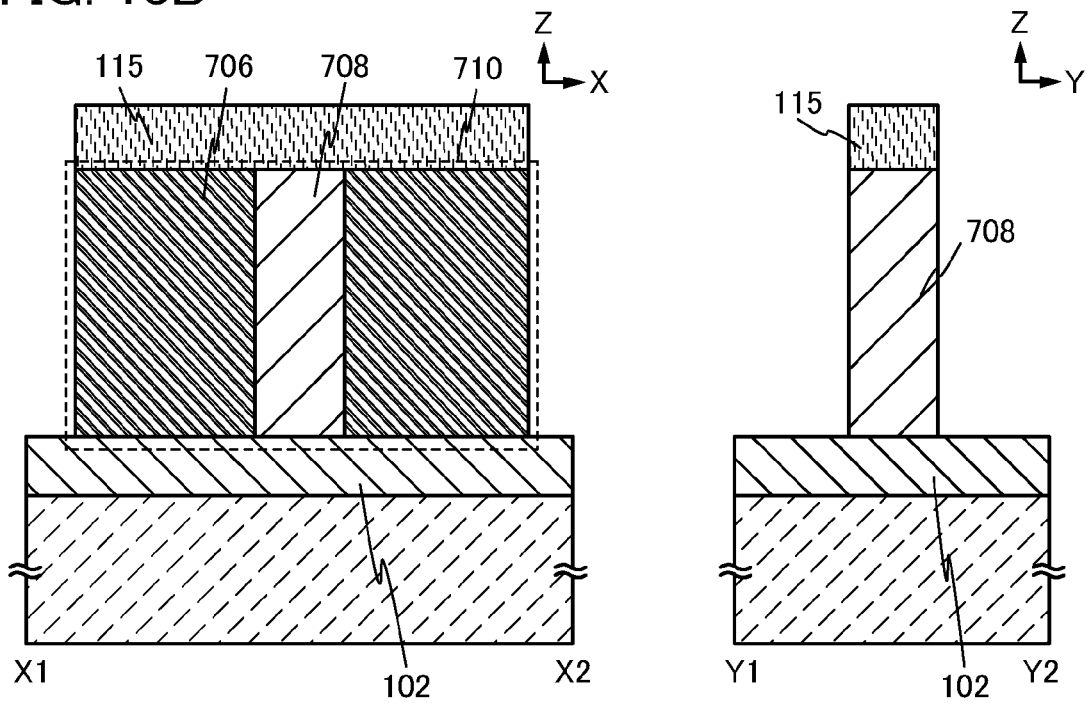

Then, like in the case of FIG. 9B, a mask 115 is formed over the conductive film 702 and the oxide semiconductor film 704 by a photolithography method, a printing method, an ink-jet method, or the like and part of the conductive film 702 and part of the oxide semiconductor film 704 are selectively removed using the mask, so that the structure body 710 including the electrodes 706 and the oxide semiconductor layer 708 is formed (see FIG. 13B). Although not illustrated in FIG. 13B, the mask 115 may be removed by treatment with a chemical solution or etching treatment after the structure body 710 is formed.

Figure 10A:
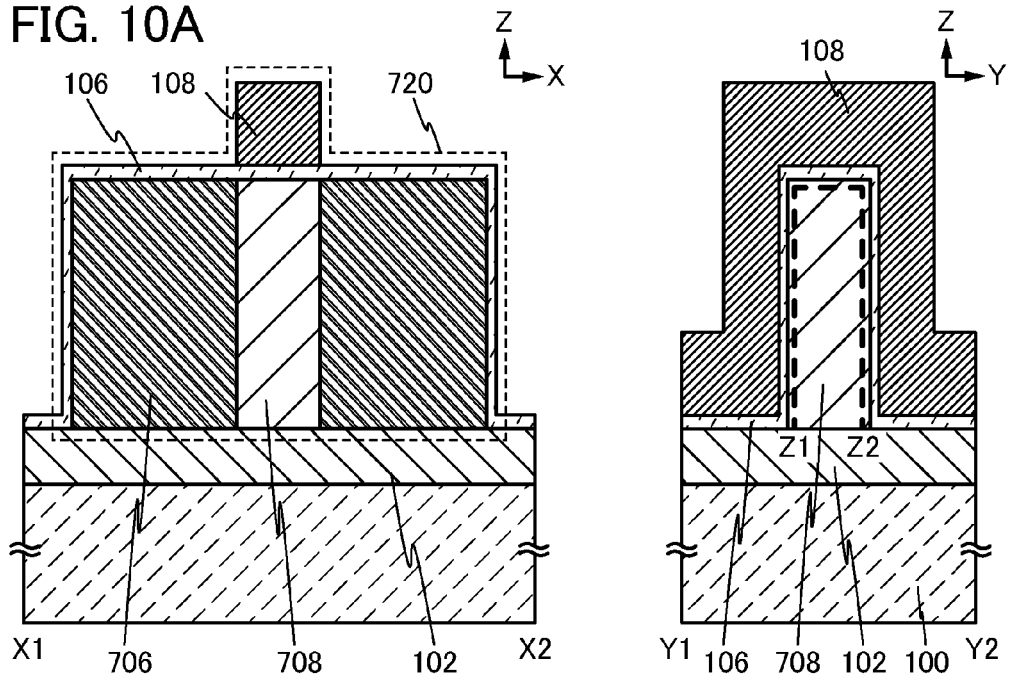
FIGS. 10A and 10B are cross-sectional views illustrating an example of a manufacturing process of a semiconductor device.
Figure 10B:
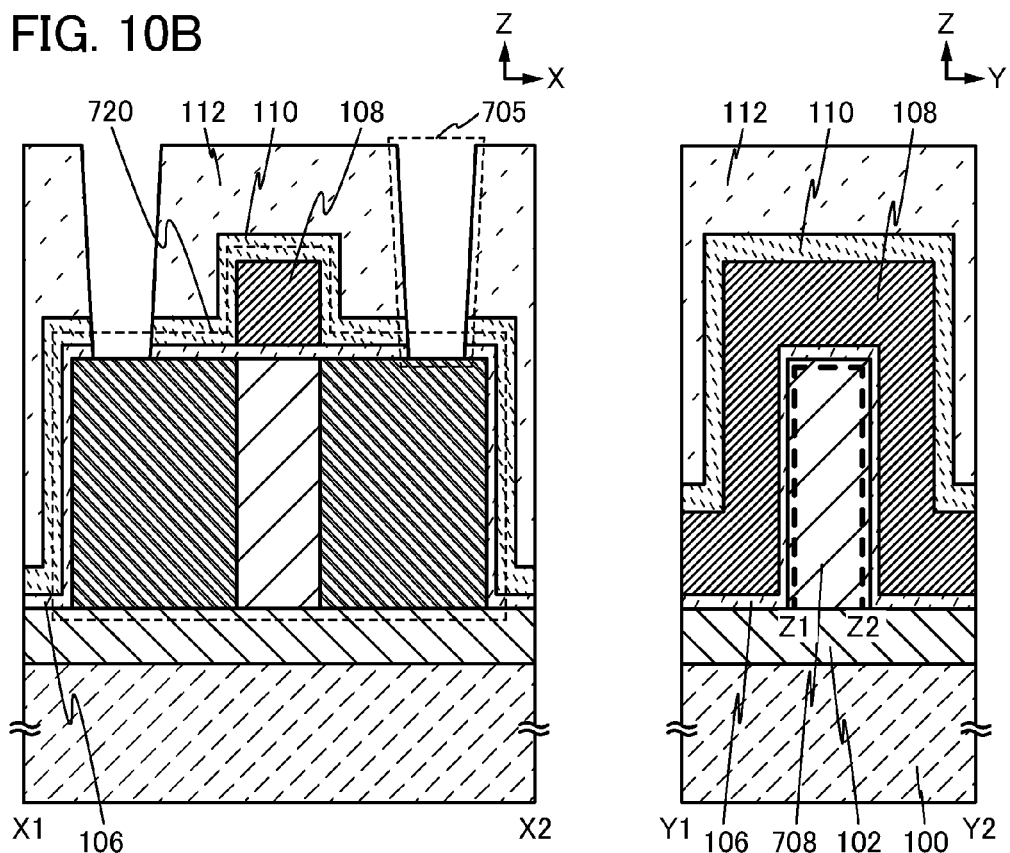

FIGS. 10A and 10B and FIG. 11 and Embodiment 2 are referred to for the subsequent steps. Accordingly, the structure including in the transistor 720 described in FIGS. 7A to 7C can be manufactured.

(Embodiment 4)

In this embodiment, an example of a semiconductor device which includes the transistor described in any of Embodiments 1 to 3, which can hold stored data even during a period in which power is not supplied, and which does not have a limitation on the number of writing cycles, is described with reference to drawings.

Figure 14A:
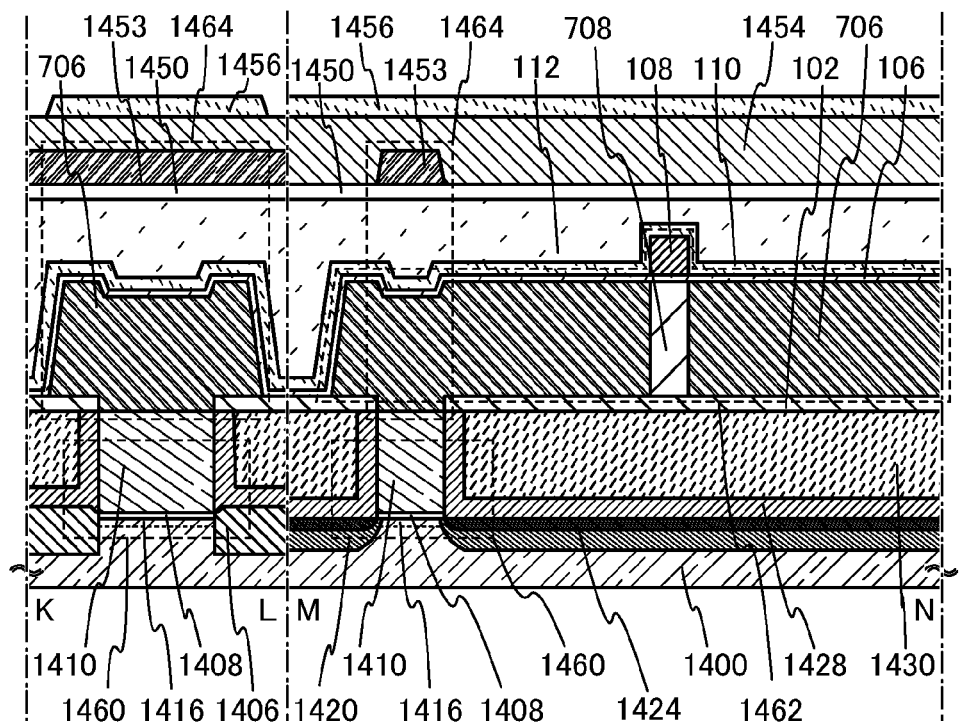
FIGS. 14A to 14C illustrate an example of a structure of a semiconductor device.
Figure 14B:
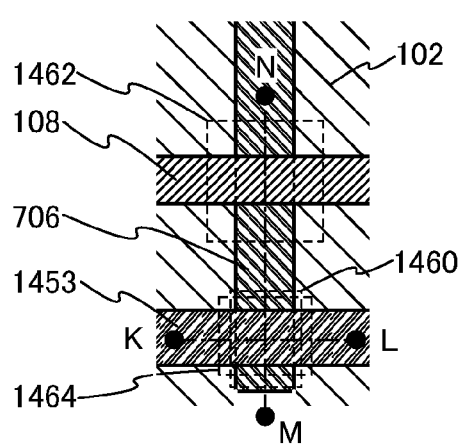
Figure 14C:
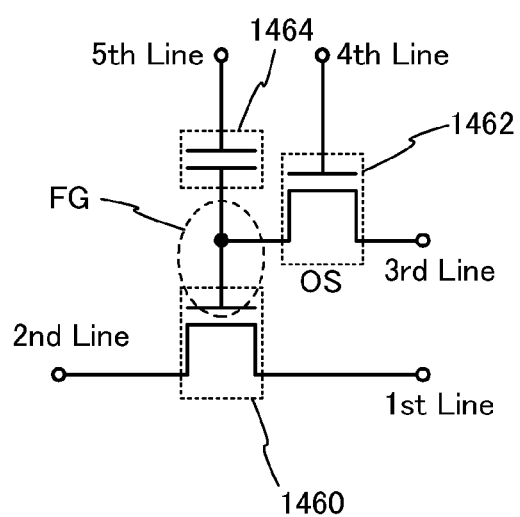

FIGS. 14A to 14C illustrate an example of a structure of a semiconductor device. FIGS. 14A to 14C illustrate a cross-sectional view, a plan view, and a circuit diagram, respectively, of the semiconductor device. Here, FIG. 14A corresponds to a cross section taken along line K-L and line M-N in FIG. 14B.

The semiconductor device illustrated in FIGS. 14A and 14B includes a transistor 1460 including a first semiconductor material in a lower portion, and a transistor 1462 including a second semiconductor material in an upper portion. Any of the structures of the transistors described in the above embodiments can be employed for the transistor 1462. Here, description is made on the case where the transistor 720 of Embodiment 2 is used.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can also be used. The specific constituent of the semiconductor device is not necessarily limited to those described here such as the material used for the semiconductor device and the structure of the semiconductor device.

The transistor 1460 in FIG. 14A includes a channel formation region 1416 provided in a substrate 1400 containing a semiconductor material (e.g., silicon), impurity regions 1420 between which the channel formation region 1416 is provided, intermetallic compound regions 1424 in contact with the impurity regions 1420, a gate insulating film 1408 provided over the channel formation region 1416, and a gate electrode 1410 provided over the gate insulating film 1408. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the "source electrode" may include a source region.

An element isolation insulating layer 1406 is provided over the substrate 1400 so as to surround the transistor 1460, and an insulating film 1428 and an insulating film 1430 are provided to cover the transistor 1460. Note that in the transistor 1460, sidewall insulating layers may be formed on a side surface of the gate electrode 1410, and the impurity regions 1420 may include regions having different impurity concentrations.

The transistor 1460 including a single crystal semiconductor substrate can operate at high speed. Thus, when the transistor is used as a reading transistor, data can be read at a high speed. Two insulating films are formed so as to cover the transistor 1460. As pretreatment for forming the transistor 1462 and a capacitor 1464 over the insulating film 1428 and the insulating film 1430, the insulating film 1428 and the insulating film 1430 are subjected to removal treatment, so that the insulating film 1428 and the insulating film 1430 are planarized and the top surface of the gate electrode 1410 is exposed. Note that the removal treatment described here is similar to the removal treatment described in Embodiment 1.

As the insulating film 1428 and the insulating film 1430, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be typically used. The insulating film 1428 and the insulating film 1430 can be formed by a plasma CVD method, a sputtering method, or the like.

Alternatively, an organic material such as a polyimide resin, an acrylic resin, or a benzocyclobutene resin can be used. Besides such organic materials, a low-dielectric constant material (a low-k material) or the like can be used. In the case of using an organic material, the insulating film 1428 and the insulating film 1430 may be formed by a wet method such as a spin coating method or a printing method.

Note that in this embodiment, a silicon nitride film is used as the insulating film 1428, and a silicon oxide film is used as the insulating film 1430.

In this embodiment, the base film 102 is formed over the insulating film 1428 and the insulating film 1430 which are sufficiently planarized (it is preferable that the average surface roughness of each of the insulating film 1428 and the insulating film 1430 is less than or equal to 0.15 nm) by polishing treatment (e.g., CMP treatment), and the oxide semiconductor layer 708 and the pair of electrodes 706 between which the oxide semiconductor layer 708 is positioned are formed over the base film 102. Part of the pair of electrodes 706 is electrically connected to the gate electrode 1410 of the transistor 1460 through an opening provided in the base film 102. Note that the pair of electrodes 706 between which the oxide semiconductor layer 708 is positioned function as a source electrode and a drain electrode. The gate insulating film 106 is provided to cover the electrodes 706 and the oxide semiconductor layer 708, and the gate electrode 108 is provided over the gate insulating film 106 to cover at least the oxide semiconductor layer 708 with the gate insulating film 106 positioned therebetween.

The transistor 1462 illustrated in FIG. 14A includes an oxide semiconductor material in the channel formation region. Here, the oxide semiconductor layer 708 included in the transistor 1462 is preferably highly purified by removing impurities such as moisture and hydrogen as much as possible, as described in the above embodiment. Further, the oxide semiconductor layer in which oxygen vacancies are sufficiently compensated is preferable. The use of such an oxide semiconductor layer makes it possible to obtain the transistor 1462 with extremely low off-state current.

Since the off-state current of the transistor 1462 is extremely small, stored data can be held for a long time owing to such a transistor. In other words, power consumption can be sufficiently reduced because a semiconductor memory device in which refresh operation is unnecessary or the frequency of refresh operation is extremely low can be provided.

The first interlayer insulating film 110, the second interlayer insulating film 112, and a third interlayer insulating film 1450 each of which is formed with a single layer or a stack of layers are provided over the transistor 1462. In this embodiment, an aluminum oxide film is used as the first interlayer insulating film 110. When the aluminum oxide film has high density (the film density is 3.2 g/cm$^3$ or higher, preferably 3.6 g/cm$^3$ or higher), the transistor 1462 can have stable electrical characteristics. A polyimide resin is used for the second interlayer insulating film 112, whereby unevenness which is generated due to the formation of the transistor 1462 is planarized. A film in which a silicon nitride oxide film and a silicon oxynitride film are stacked in this order is used as the third interlayer insulating film 1450. Accordingly, diffusion of impurities from the second interlayer insulating film 112 toward the upper layer can be prevented.

A conductive layer 1453 is provided in a region which overlaps with the electrode 706 of the transistor 1462 with the first interlayer insulating film 110, the second interlayer insulating film 112, and the third interlayer insulating film 1450 positioned therebetween. The electrode 706, the first interlayer insulating film 110, the second interlayer insulating film 112, the third interlayer insulating film 1450, and the conductive layer 1453 form a capacitor 1464. That is, one of the pair of electrodes included in the transistor 1462 functions as one electrode of the capacitor 1464, and the conductive layer 1453 functions as the other electrode of the capacitor 1464. Note that in the case where a capacitor is not needed, the capacitor 1464 may be omitted. Alternatively, the capacitor 1464 may be separately provided above the transistor 1462.

An insulating film 1454 is provided over the transistor 1462 and the capacitor 1464. In addition, a wiring 1456 for connecting the transistor 1462 and another transistor to each other is provided over the insulating film 1454. Although not illustrated in FIG. 14A, the wiring 1456 is electrically connected to the electrode 706 through an opening which is formed in the first interlayer insulating film 110, the second interlayer insulating film 112, the third interlayer insulating film 1450, the insulating film 1454, and the like.

In FIGS. 14A and 14B, the transistor 1460 is provided so as to overlap with at least part of the transistor 1462. The source region or the drain region of the transistor 1460 and the oxide semiconductor layer 708 are preferably provided so as to overlap with each other at least partly. Further, the transistor 1462 and the capacitor 1464 are provided to overlap with at least part of the transistor 1460. For example, the conductive layer 1453 of the capacitor 1464 is provided so as to overlap with the gate electrode 1410 of the transistor 1460 at least partly. With such a planar layout, the area occupied by the semiconductor device can be reduced; thus, higher integration can be achieved.

The electrical connection between the electrode 706 and the wiring 1456 may be established by direct contact between the electrode 706 and the wiring 1456, or established using an electrode which is provided in the insulating film positioned between the electrode 706 and the wiring 1456. Alternatively, the electrical connection may be established using a plurality of electrodes.

Next, an example of a circuit configuration corresponding to FIGS. 14A and 14B is illustrated in FIG. 14C.

In FIG. 14C, a first wiring (a 1st line) is electrically connected to the source electrode of the transistor 1460, and a second wiring (a 2nd line) is electrically connected to the drain electrode of the transistor 1460. A third wiring (a 3rd line) is electrically connected to the source electrode (or the drain electrode) of the transistor 1462, and a fourth wiring (a 4th line) is electrically connected to the gate electrode of the transistor 1462. The gate electrode of the transistor 1460 and the drain electrode (or the source electrode) of the transistor 1462 are electrically connected to the other electrode of the capacitor 1464, and a fifth wiring (a 5th line) is electrically connected to the one electrode of the capacitor 1464.

The semiconductor device in FIG. 14C can write, hold, and read data as described below, utilizing a characteristic in which the potential of the gate electrode of the transistor 1460 can be held.

Writing and holding of data are described. First, the potential of the fourth wiring is set to a potential at which the transistor 1462 is turned on, so that the transistor 1462 is turned on. Accordingly, the potential of the third wiring is supplied to the gate electrode of the transistor 1460 and the capacitor 1464. In other words, a predetermined charge is supplied to the gate electrode of the transistor 1460 (writing). Here, charge for supply of a potential level or charge for supply of a different potential level (hereinafter referred to as Low-level charge and High-level charge) is given. After that, the potential of the fourth wiring is set to a potential at which the transistor 1462 is off, so that the transistor 1462 is turned off. Thus, the charge supplied to the gate electrode of the transistor 1460 is held (holding).

Since the off-state current of the transistor 1462 is extremely low, the charge of the gate electrode of the transistor 1460 is held for a long time.

Next, reading of data is described. When an appropriate potential (reading potential) is supplied to the fifth wiring with a predetermined potential (constant potential) supplied to the first wiring, the potential of the second wiring varies depending on the amount of charge held in the gate electrode of the transistor 1460. This is because in general, when the transistor 1460 is an n-channel transistor, an apparent threshold voltage $V_{th\_H}$ in the case where High-level charge is supplied to the gate electrode of the transistor 1460 is lower than an apparent threshold voltage $V_{th\_L}$ in the case where Low-level charge is supplied to the gate electrode of the transistor 1460. Here, the apparent threshold voltage refers to the potential of the fifth wiring which is needed to turn on the transistor 1460. Thus, the potential of the fifth wiring is set to a potential $V_0$ that is between $V_{th\_H}$ and $V_{th\_L}$, whereby charge applied to the gate electrode of the transistor 1460 can be determined. For example, in the case where High-level charge is supplied at the time of writing, when the potential of the fifth wiring is $V_0$ ($>V_{th\_H}$), the transistor 1460 is turned on. In the case where Low-level electric charge is supplied at the time of writing, even when the potential of the fifth wiring is $V_0$ ($<V_{th\_L}$), the transistor 1460 remains in an off state. Therefore, the stored data can be read by measuring the potential of the second wiring.

Note that in the case where memory cells are arrayed to be used, only data of desired memory cells needs to be read. In the case where such reading is not performed, a potential at which the transistor 1460 is turned off regardless of the state of the gate electrode of the transistor 1460, that is, a potential smaller than $V_{th\_H}$ may be supplied to the fifth wiring. Alternatively, a potential at which the transistor 1460 is turned on, that is, a potential higher than $V_{th\_L}$ may be supplied to the fifth wiring regardless of the state of the gate electrode of the transistor 1460.

When a transistor having a channel formation region formed using an oxide semiconductor and having extremely small off-state current is applied to the semiconductor device in this embodiment, the semiconductor device can store data for an extremely long time. In other words, power consumption can be adequately reduced because refresh operation becomes unnecessary or the frequency of refresh operation can be extremely low. Moreover, stored data can be held for a long time even when power is not supplied (note that a potential is preferably fixed).

Further, in the semiconductor device described in this embodiment, a high voltage is not needed for writing data and there is no problem of deterioration of elements. For example, unlike in the case of a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of writing cycles which is a problem in a conventional nonvolatile memory, and reliability thereof is drastically improved. Furthermore, data is written depending on the on state and the off state of the transistor, whereby high-speed operation can be easily achieved.

As described above, a miniaturized and highly-integrated semiconductor device having high electric characteristics and a method for manufacturing the semiconductor device can be provided.

The methods and structures described in this embodiment can be combined as appropriate with any of the methods and structures described in the other embodiments.

(Embodiment 5)

In this embodiment, a semiconductor device which includes the transistor described in any of Embodiments 1 to 3, can hold stored data even when not powered, does not have a limitation on the number of write cycles, and has a structure different from the structure described in Embodiment 4 is described with reference to FIGS. 15A and 15B and FIGS. 16A and 16B.

Figure 15A:
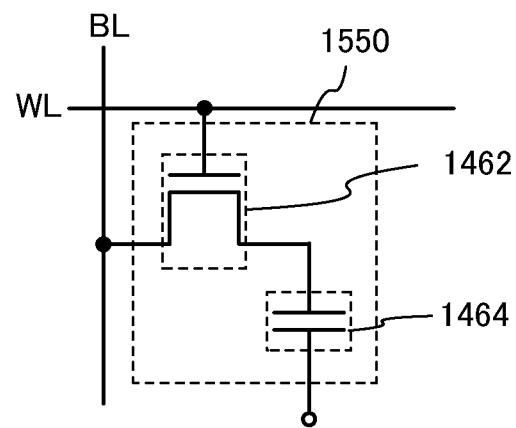
FIGS. 15A and 15B illustrate an example of a structure of a semiconductor device.
Figure 15B:
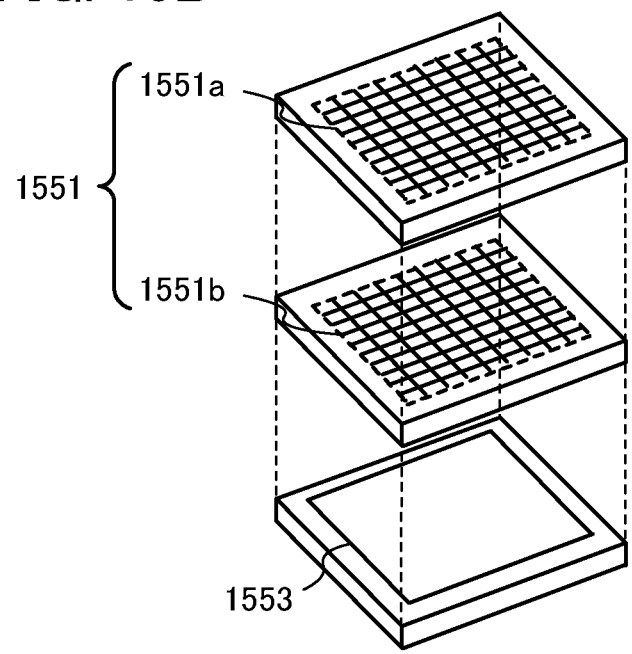

FIG. 15A illustrates an example of a circuit configuration of a semiconductor device, and FIG. 15B is a conceptual diagram illustrating an example of a semiconductor device. First, the semiconductor device illustrated in FIG. 15A is described, and then, the semiconductor device illustrated in FIG. 15B is described.

In the semiconductor device illustrated in FIG. 15A, a bit line BL is electrically connected to a source electrode or a drain electrode of the transistor 1462, a word line WL is electrically connected to a gate electrode of the transistor 1462, and the source electrode or the drain electrode of the transistor 1462 is electrically connected to a first terminal of the capacitor 1464.

Next, writing and holding of data in the semiconductor device (a memory cell 1550) illustrated in FIG. 15A are described.

First, the potential of the word line WL is set to a potential at which the transistor 1462 is turned on, so that the transistor 1462 is turned on. Accordingly, the potential of the bit line BL is supplied to the first terminal of the capacitor 1464 (writing). After that, the potential of the word line WL is set to a potential at which the transistor 1462 is turned off, so that the transistor 1462 is turned off. Thus, the potential at the first terminal of the capacitor 1464 is held (holding).

Off-state current is extremely small in the transistor 1462 which uses an oxide semiconductor. For that reason, a potential of the first terminal of the capacitor 1464 (or a charge accumulated in the capacitor 1464) can be held for an extremely long time by turning off the transistor 1462.

Secondly, reading of data is described. When the transistor 1462 is turned on, the bit line BL which is in a floating state and the capacitor 1464 are electrically connected to each other, and the charge is redistributed between the bit line BL and the capacitor 1464. As a result, the potential of the bit line BL is changed. The amount of a change in potential of the bit line BL varies depending on the potential of the first terminal of the capacitor 1464 (or the charge accumulated in the capacitor 1464).

For example, the potential of the bit line BL after charge redistribution is $(C_B \times V_{B0}+C+V)/(C_B+C)$, where V is the potential of the first terminal of the capacitor 1464, C is the capacitance of the capacitor 1464, $C_B$ is the capacitance of the bit line BL (hereinafter also referred to as a bit line capacitance), and $V_{B0}$ is the potential of the bit line BL before the charge redistribution. Therefore, it can be found that assuming that the memory cell 1550 is in either of two states in which the potentials of the first terminal of the capacitor 1464 are $V_1$ and $V_0$ ($V_1 > V_0$), the potential of the bit line BL in the case of holding the potential $V_1$ ($=(C_B \times V_{B0}+C \times V_1)/(C_B+C)$) is higher than the potential of the bit line BL in the case of retaining the potential $V_0$ ($=(C_B \times V_{B0}+C \times V_0)/(C_B+C)$).

Then, by comparing the potential of the bit line BL with a predetermined potential, data can be read.

As described above, the semiconductor device illustrated in FIG. 15A can hold charge that is accumulated in the capacitor 1464 for a long time because the off-state current of the transistor 1462 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 15B is described.

The semiconductor device illustrated in FIG. 15B includes a memory cell arrays 1551a and 1551b each including a plurality of memory cells 1550 illustrated in FIG. 15A as memory circuits in the upper portion, and a peripheral circuit 1553 in the lower portion which is necessary for operating memory cell arrays 1551 (the memory cell arrays 1551a and 1551b). Note that the peripheral circuit 1553 is electrically connected to the memory cell arrays 1551. With such a circuit structure, the semiconductor device can be reduced in size.

It is preferable that a semiconductor material of the transistor provided in the peripheral circuit 1553 is different from that of the transistor 1462 in Embodiment 4. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably obtained by the transistor.

Note that FIG. 15B illustrates, as an example, the semiconductor device in which two memory cell arrays 1551 (the memory cell arrays 1551a and 1551b) are stacked; however, the number of memory cell arrays to be stacked is not limited thereto. Three or more memory arrays may be stacked.

Next, a specific structure of the memory cell 1550 illustrated in FIG. 15A is described with reference to FIGS. 16A and 16B.

Figure 16A:
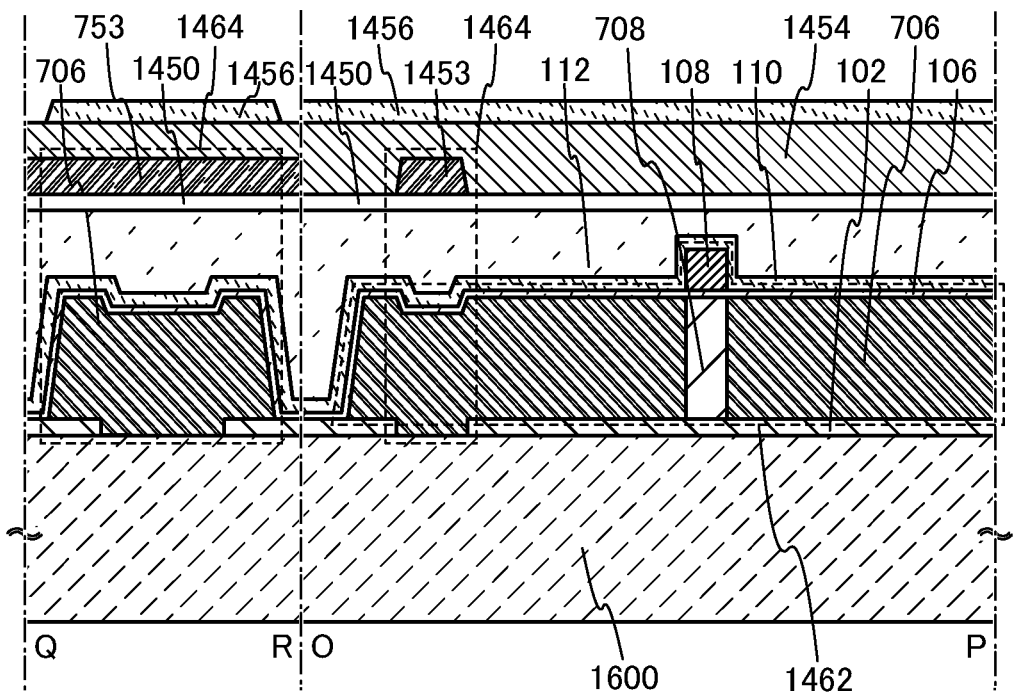
FIGS. 16A and 16B illustrate an example of a structure of a semiconductor device.
Figure 16B:
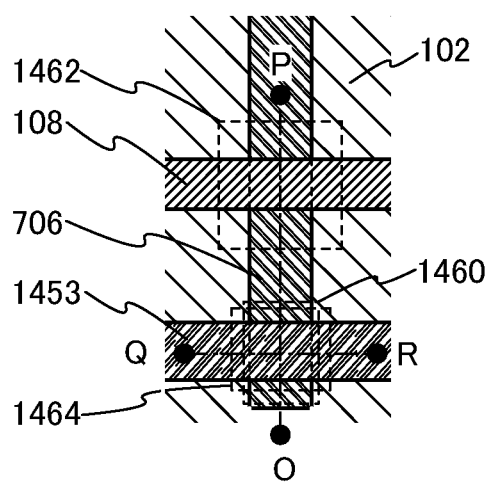

FIGS. 16A and 16B illustrate an example of a structure of the memory cell 1550. FIGS. 16A and 16B are respectively a cross-sectional view and a plan view of the memory cell 1550. Here, FIG. 16A illustrates a cross section taken along line O-P and line Q-R in FIG. 16B.

The transistor 1462 provided over a substrate 1600 with the base film 102 positioned therebetween can have a structure which is similar to any of the structures described in Embodiments 1 to 3.

The first interlayer insulating film 110, the second interlayer insulating film 112, and the third interlayer insulating film 1450 each of which is formed with a single layer or a stack of layers are provided over the transistor 1462. The conductive layer 1453 is provided in a region overlapping with the electrode 706 of the transistor 1462 with the first interlayer insulating film 110, the second interlayer insulating film 112, and the third interlayer insulating film 1450 positioned therebetween. The electrode 706, the first interlayer insulating film 110, the second interlayer insulating film 112, the third interlayer insulating film 1450, and the conductive layer 1453 form the capacitor 1464. That is, the electrode 706 of the transistor 1462 function as one electrode of the capacitor 1464, and the conductive layer 1453 functions as the other electrode of the capacitor 1464.

The insulating film 1454 is provided over the transistor 1462 and the capacitor 1464. In addition, the wiring 1456 for connecting adjacent memory cells 1550 to each other is provided over the insulating film 1454. Although not illustrated, the wiring 1456 is electrically connected to the electrode 706 of the transistor 1462 through an opening which is formed in the first interlayer insulating film 110, the second interlayer insulating film 112, the third interlayer insulating film 1450, the insulating film 1454, and the like. The wiring 1456 may be electrically connected to the electrode 706 through another conductive layer provided in the opening. The wiring 1456 corresponds to the bit line BL in the circuit diagram of FIG. 15A.

In FIGS. 16A and 16B, the electrodes 706 of the transistor 1462 can also function as a source electrode of a transistor included in an adjacent memory cell.

With such a planar layout in FIG. 16A, the area occupied by the semiconductor device can be reduced; thus, higher integration can be achieved.

As described above, the plurality of memory cells formed in multiple layers in the upper portion is each formed with a transistor including an oxide semiconductor. Since the off-state current of the transistor including an oxide semiconductor is small, stored data can be held for a long time owing to such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly-integrated semiconductor device having high electric characteristics and a method for manufacturing the semiconductor device can be provided.

This embodiment can be implemented in appropriate combination with any of the structures described in the other embodiments.

(Embodiment 6)

In this embodiment, examples of application of the semiconductor device described in any of the above embodiments to portable devices such as mobile phones, smartphones, or e-book readers are described with reference to FIGS. 17A and 17B, FIG. 18, FIG. 19, and FIG. 20.

In portable electronic devices such as a mobile phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 17A:
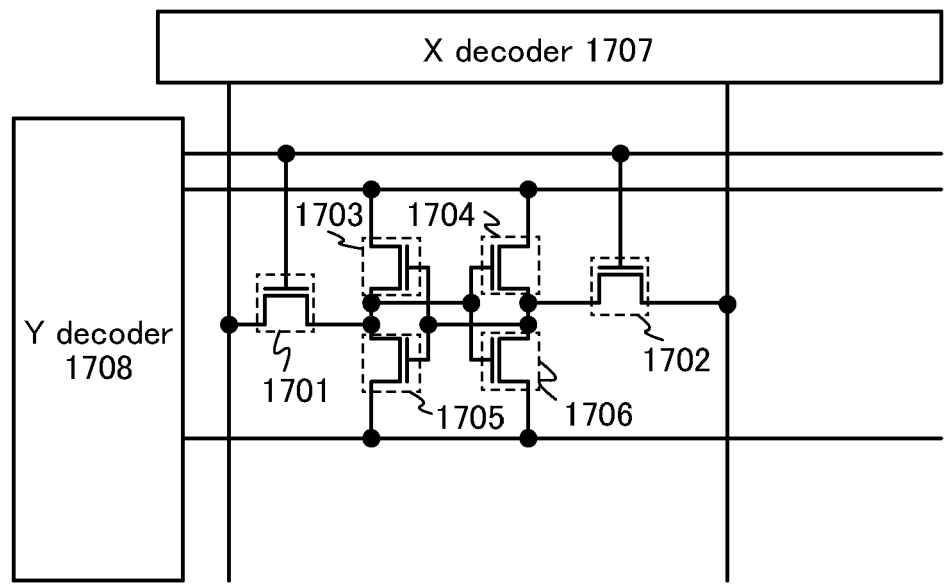
FIGS. 17A and 17B each illustrate an example of a structure of a semiconductor device.

In an ordinary SRAM, as illustrated in FIG. 17A, one memory cell includes six transistors, that is, transistors 1701 to 1706, which are driven with an X decoder 1707 and a Y decoder 1708. A pair of the transistors 1703 and 1705 and a pair of the transistors 1704 and 1706 which each form an inverter allow high-speed operation. However, an SRAM has a disadvantage of large cell area because one memory cell includes six transistors. Provided that the minimum feature size of a design rule is F, the area of a memory cell in an SRAM is generally $100 F^2$ to $150 F^2$. Therefore, a price per bit of an SRAM is the most expensive among a variety of memory devices.

Figure 17B:
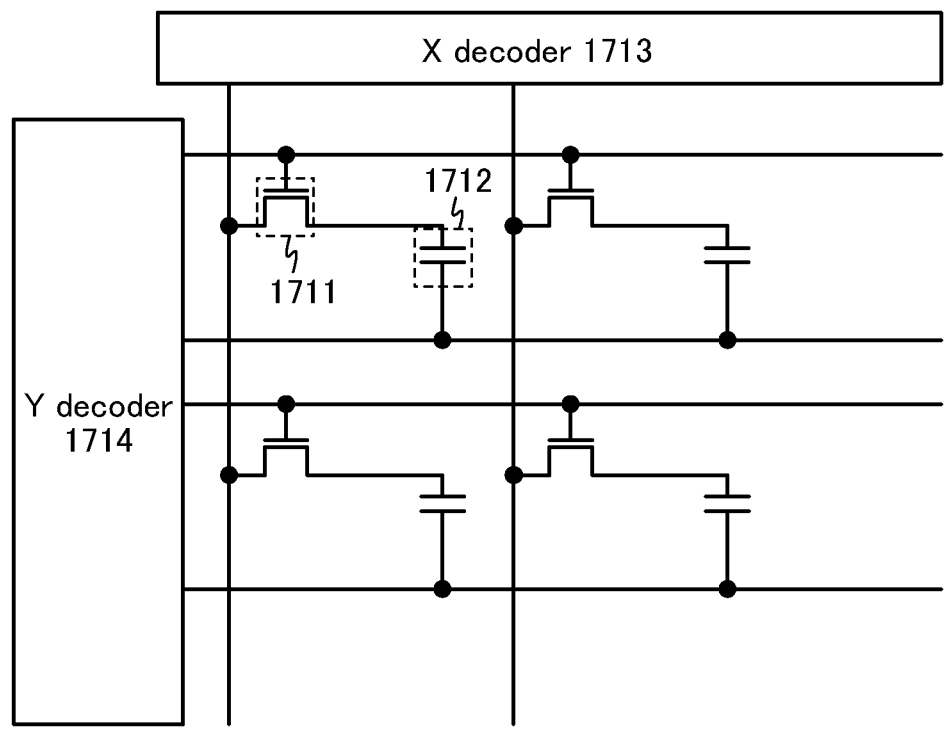

In a DRAM, as illustrated in FIG. 17B, a memory cell includes a transistor 1711 and a storage capacitor 1712, which are driven with an X decoder 1713 and a Y decoder 1714. One cell includes one transistor and one capacitor and thus the area of a memory cell is small. The area of a memory cell of a DRAM is generally less than or equal to $10 F^2$. Note that in the case of a DRAM, a refresh operation is always necessary and power is consumed even when a rewriting operation is not performed.

However, the area of the memory cell of the semiconductor device described the above embodiments is about $10 F^2$ and frequent refreshing is not needed. Therefore, the area of the memory cell is reduced, and the power consumption can be reduced.

Figure 18:
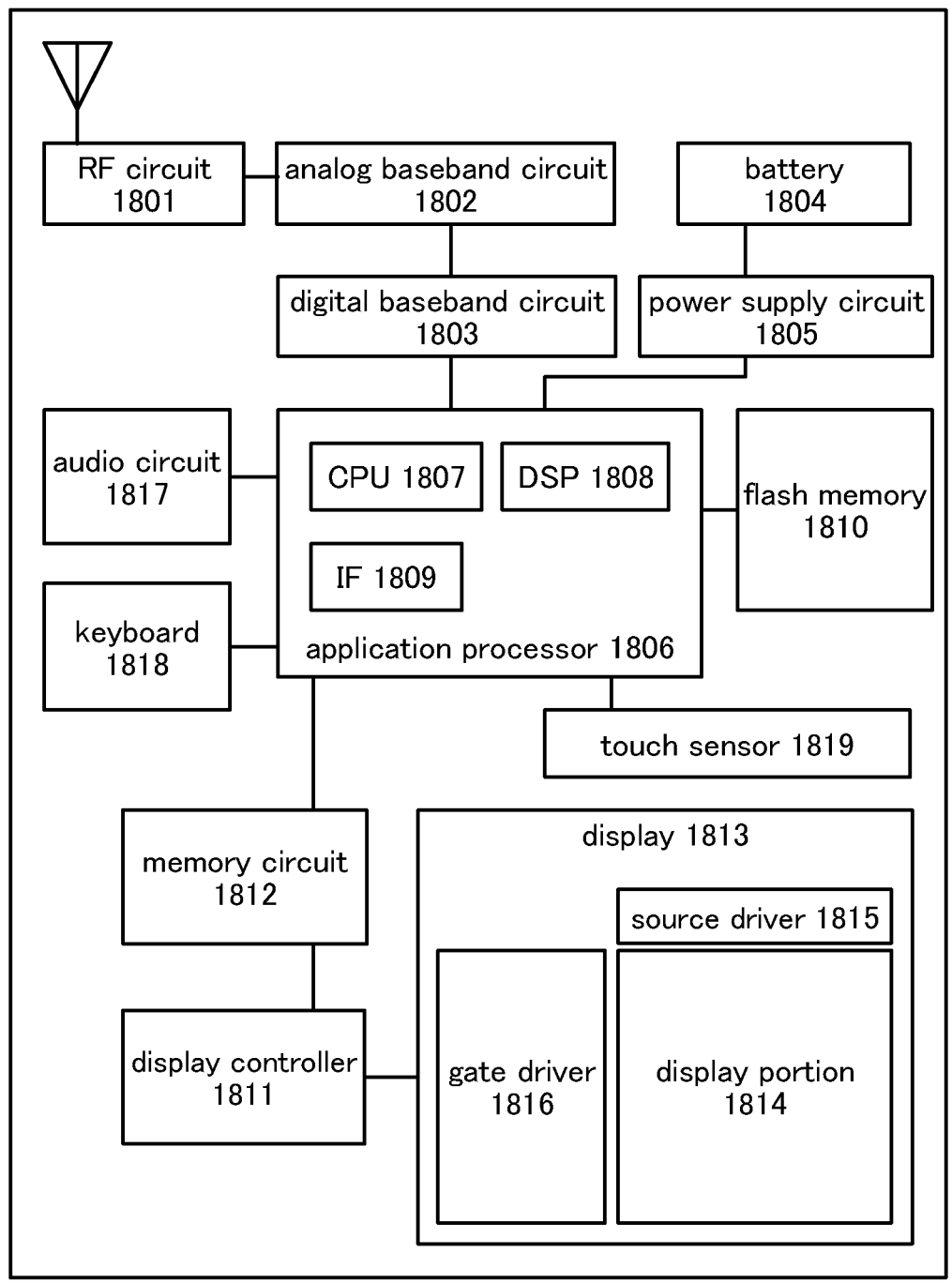
FIG. 18 illustrates an example of a structure of a semiconductor device.

FIG. 18 is a block diagram of a portable device. The portable device illustrated in FIG. 18 includes an RF circuit 1801, an analog baseband circuit 1802, a digital baseband circuit 1803, a battery 1804, a power supply circuit 1805, an application processor 1806, a flash memory 1810, a display controller 1811, a memory circuit 1812, a display 1813, a touch sensor 1819, an audio circuit 1817, a keyboard 1818, and the like. The display 1813 includes a display portion 1814, a source driver 1815, and a gate driver 1816. The application processor 1806 includes a CPU 1807, a DSP 1808, and an interface (IF) 1809. In general, the memory circuit 1812 includes an SRAM or a DRAM; by employing the semiconductor device described in any of the above embodiments for the memory circuit 1812, writing and reading of data can be performed at high speed, data can be held for a long time, and power consumption can be sufficiently reduced.

Figure 19:
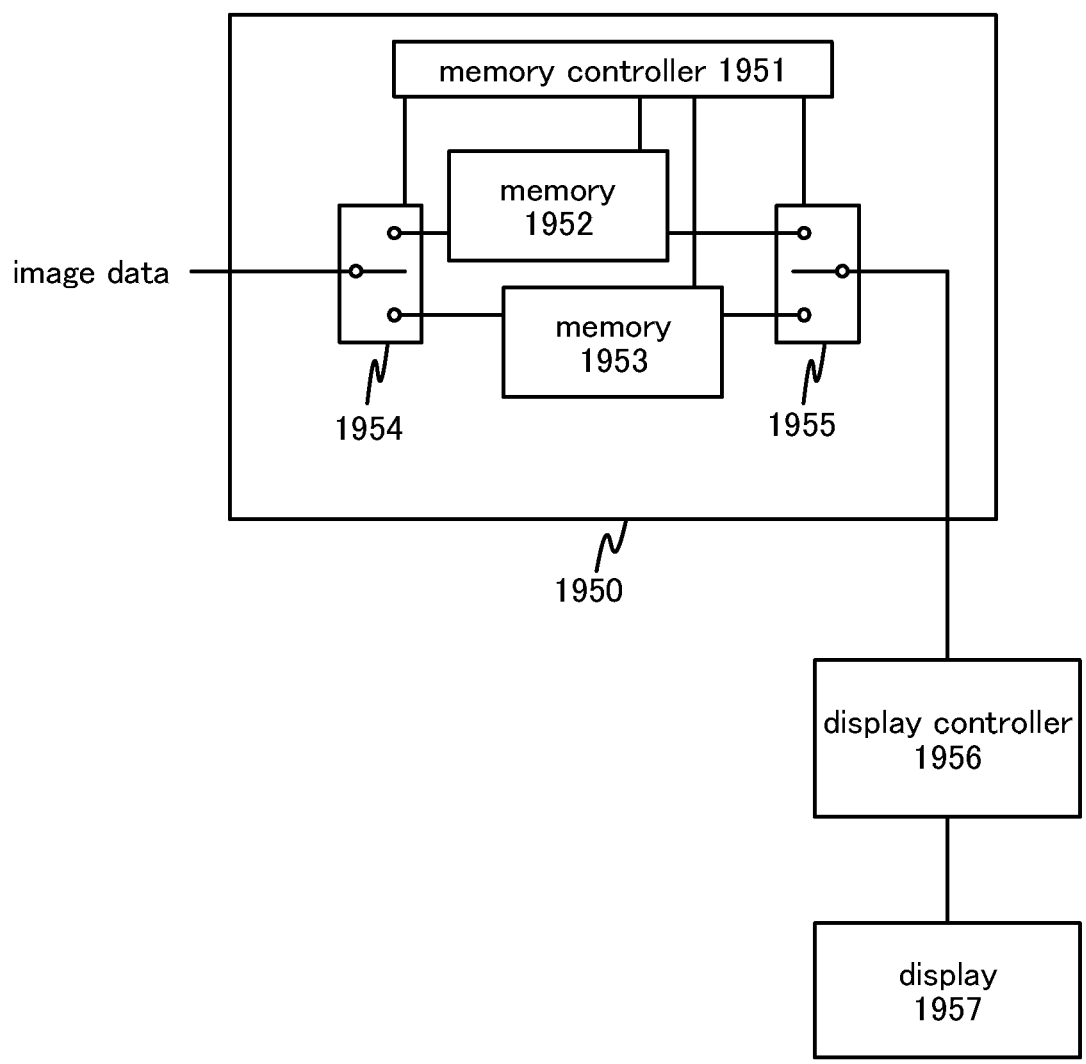
FIG. 19 illustrates an example of a structure of a semiconductor device.

FIG. 19 illustrates an example of using the semiconductor device described in any of the above embodiments in a memory circuit 1950 for a display. The memory circuit 1950 illustrated in FIG. 19 includes a memory 1952, a memory 1953, a switch 1954, a switch 1955, and a memory controller 1951. Further, the memory circuit is connected to a display controller 1956 which reads and controls image data input through a signal line (input image data) and data stored in the memories 1952 and 1953 (stored image data), and is also connected to a display 1957 which displays an image based on a signal input from the display controller 1956.

First, image data (input image data A) is formed by an application processor (not shown). The input image data A is stored in the memory 1952 through the switch 1954. Then, the image data stored in the memory 1952 (stored image data A) is transmitted to the display 1957 through the switch 1955 and the display controller 1956, and is displayed on the display 1957.

When the input image data A remains unchanged, the stored image data A is read from the memory 1952 through the switch 1955 by the display controller 1956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 1953 through the switch 1954. Also during that time, the stored image data A is regularly read from the memory 1952 through the switch 1955. After the completion of storing the new image data (the stored image data B) in the memory 1953, from the next frame for the display 1957, the stored image data B starts to be read, transmitted to the display 1957 through the switch 1955 and the display controller 1956, and displayed on the display 1957. This reading operation is continued until the next new image data is stored in the memory 1952.

By alternately writing and reading image data to and from the memory 1952 and the memory 1953 as described above, images are displayed on the display 1957. Note that the memory 1952 and the memory 1953 are not limited to separate memories, and a single memory may be divided and used. By employing the semiconductor device described in any of the above embodiments for the memory 1952 and the memory 1953, data can be written and read at high speed and held for a long time, and power consumption can be sufficiently reduced.

Figure 20:
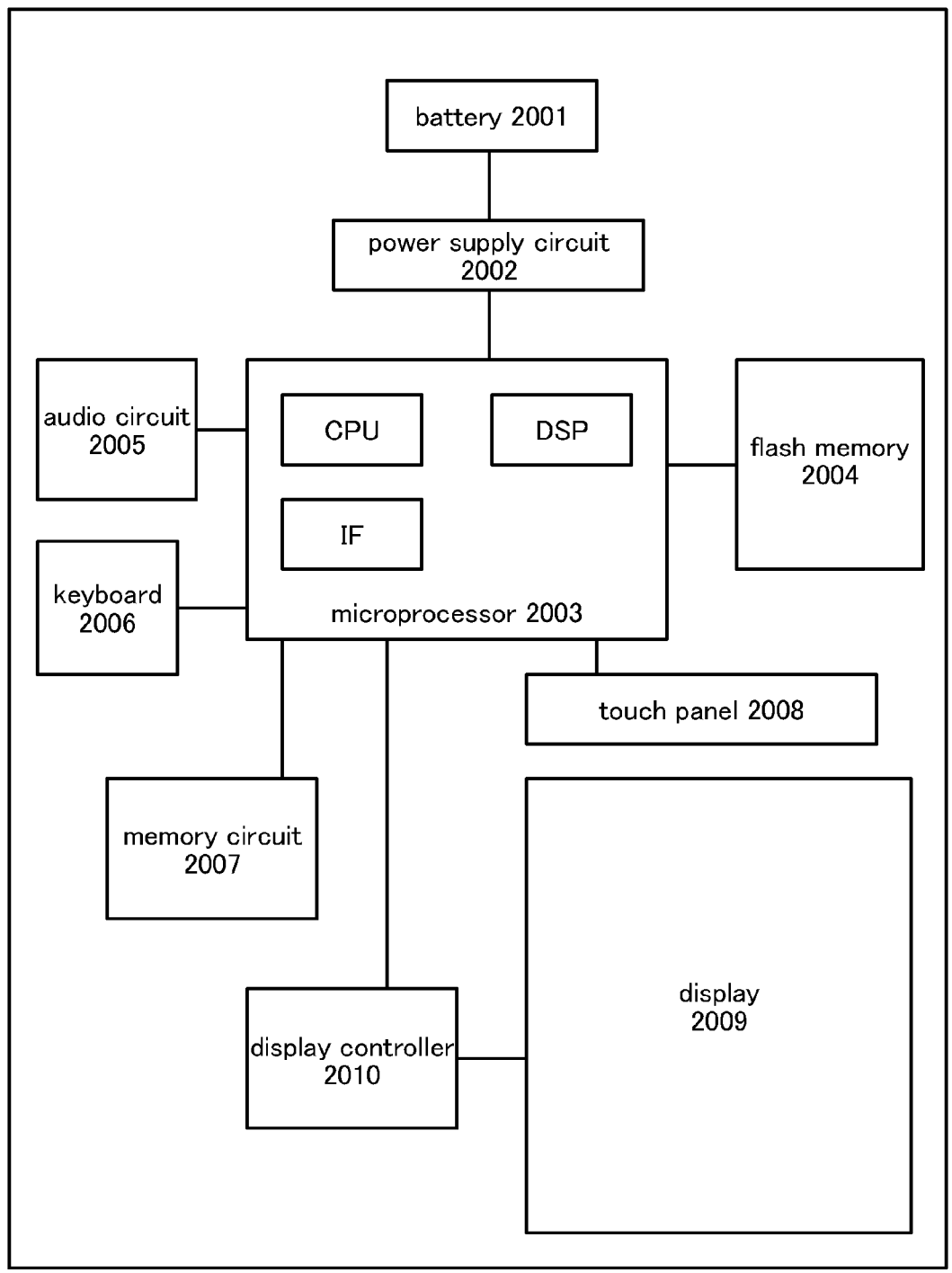
FIG. 20 illustrates an example of a structure of a semiconductor device.

Next, FIG. 20 shows a block diagram of an e-book reader. FIG. 20 includes a battery 2001, a power supply circuit 2002, a microprocessor 2003, a flash memory 2004, an audio circuit 2005, a keyboard 2006, a memory circuit 2007, a touch panel 2008, a display 2009, and a display controller 2010.

Here, the semiconductor device described in any of the above embodiments can be used for the memory circuit 2007 in FIG. 20. The memory circuit 2007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to retain that content for a long period, that content may be copied to the flash memory 2004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the other structures, methods, and the like described in the other embodiments.

(Embodiment 7)

A semiconductor device disclosed in this specification can be applied to a variety of electronic devices (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 21A:
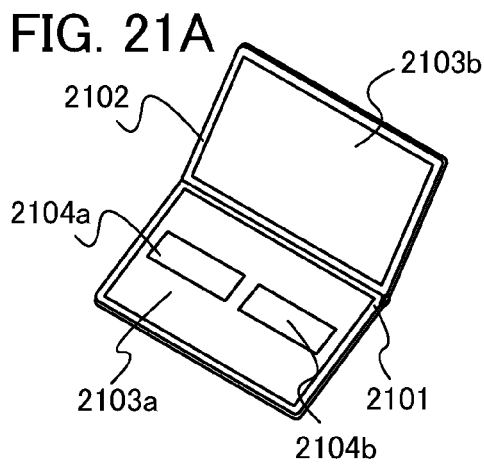
FIGS. 21A to 21E each illustrate an electronic appliance.

FIG. 21A illustrates a portable information terminal which includes a housing 2101, a housing 2102, a first display portion 2103a, a second display portion 2103b, and the like. A variety of electronic components (e.g., CPU, MPU, or a memory element) are incorporated inside the housing 2101 and the housing 2102. Further, electronic circuits (e.g., a driver circuit and a selection circuit) necessary for displaying an image are mounted on the first display portion 2103a and the second display portion 2103b. The semiconductor device described in any of the above embodiments is used in these electronic components and electronic circuits, whereby a portable information terminal with high reliability can be provided. Note that the semiconductor device according to any of the above embodiments is preferably provided in at least one of the housing 2101 and the housing 2102.

At least one of the first display portion 2103a and the second display portion 2103b is a touch panel, and for example, as illustrated in the left in FIG. 21A, which of "touch input" and "keyboard input" is performed can be selected by selection buttons 2104a and 2104b displayed on the first display portion 2103a. Since the selection buttons with a variety of sizes can be displayed, the portable information terminal can be easily used by people of any generation. In the case where "keyboard input" is selected, for example, a keyboard 2105 is displayed on the first display portion 2103a as illustrated in the right in FIG. 21A. With such a structure, letters can be input quickly by keyboard input as in the case of using a conventional information terminal, for example.

Further, the housing 2101 and the housing 2102 of the portable information terminal in FIG. 21A can be separated as illustrated in the right in FIG. 21A. This structure enables very convenient operations; for example, screen data can be controlled from the housing 2102 while the screen data is shared by a plurality of people with the housing 2101 hung on a wall. Note that in the case where the device is not in use, the housing 2101 and the housing 2102 are preferably made to overlap such that the first display portion 2103a faces the second display portion 2103b. In this manner, the first display portion 2103a and the second display portion 2103b can be protected from an external shock. The first display portion 2103a can also function as a touch panel for a reduction in weight to carry around to be operated by one hand while the other hand supports the housing 2102, which is very convenient.

The mobile phone illustrated in FIG. 21A can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 21A may transmit and receive data wirelessly. Through wireless communication, desired book data or the like can be purchased and downloaded from an electronic book server.

Further, the housing 2101 or the housing 2102 illustrated in FIG. 21A may be equipped with an antenna, a microphone function, or a wireless communication function, so that the portable information terminal may be used as a mobile phone.

Figure 21C:
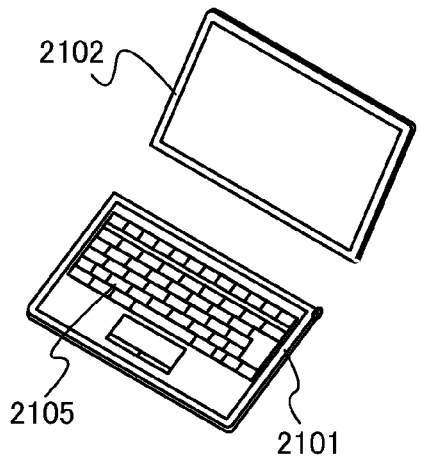
Figure 21B:
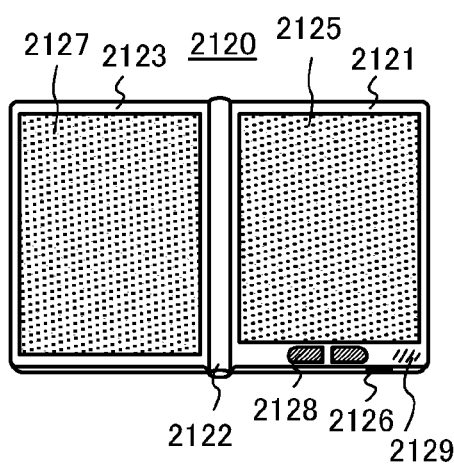

FIG. 21B illustrates an example of an e-book reader. For example, an e-book reader 2120 includes two housings of a housing 2121 and a housing 2123. The housing 2121 and the housing 2123 are combined with a hinge 2122 so that the e-book reader 2120 can be opened and closed with the hinge 2122 as an axis. With such a structure, the e-book reader 2120 can operate like a paper book.

A display portion 2125 and a display portion 2127 are incorporated in the housing 2121 and the housing 2123, respectively. The display portion 2125 and the display portion 2127 may display one image or different images. In the case where the display portion 2125 and the display portion 2127 display different images, for example, text can be displayed on a display portion on the right side (the display portion 2125 in FIG. 21B) and images can be displayed on a display portion on the left side (the display portion 2127 in FIG. 21B). By applying the semiconductor device described in any of the above embodiments, the e-book reader 2120 can have high reliability.

FIG. 21B illustrates an example in which the housing 2121 is provided with an operation portion and the like. For example, the housing 2121 is provided with a power switch 2126, an operation key 2128, a speaker 2129, and the like. The page can be turned with the operation key 2128. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 2120 may have a function of an electronic dictionary.

The e-book reader 2120 may be configured to transmit and receive data wirelessly. Through wireless communication, desired book data or the like can be purchased and downloaded from an electronic book server.

FIG. 21C illustrates a smartphone, which includes a housing 2130, a button 2131, a microphone 2132, a display portion 2133 provided with a touch panel, a speaker 2134, and a camera lens 2135 and functions as a mobile phone. By applying the semiconductor device described in Embodiment 1 or 2, the smartphone can have high reliability.

The display portion 2133 changes the direction of display as appropriate depending on a use mode. Since the camera lens 2135 is provided on the same plane as the display portion 2133, videophone is possible. The speaker 2134 and the microphone 2132 can be used not only for voice calls, but also for video phone calls, recording, playing sound, and the like.

An external connection terminal 2136 can be connected to an AC adapter and various types of cables such as a USB cable, and charging and data communication with a personal computer are possible. Furthermore, a large amount of data can be stored and moved by inserting a storage medium into the external memory slot (not illustrated).

Further, in addition to the above functions, an infrared communication function, a television reception function, or the like may be provided.

Figure 21D:
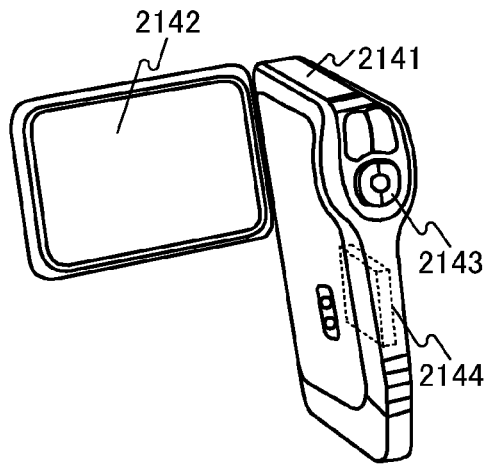

FIG. 21D illustrates a digital video camera which includes a main body 2141, a display portion 2142, an operation switch 2143, a battery 2144, and the like. By applying the semiconductor device described in any of the above embodiments, the digital video camera can have high reliability.

Figure 21E:
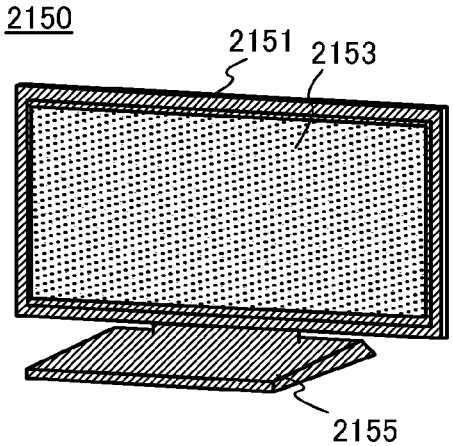

FIG. 21E illustrates an example of a television set. In a television set 2150, a display portion 2153 is incorporated in a housing 2151. The display portion 2153 can display images. In this example, the housing 2151 is supported by a stand 2155. By applying the semiconductor device described in any of the above embodiments, the television set 2150 can have high reliability.

The television set 2150 can be operated with an operation switch of the housing 2151 or a separate remote controller. Further, the remote controller may be provided with a display portion for displaying data output from the remote controller.

Note that the television set 2150 is provided with a receiver, a modem, and the like. Moreover, when the display device is connected to a communication network with or without wires via the modem, one-way (from a sender to a receiver) or two-way (between a sender and a receiver or between receivers) information communication can be performed.

The methods and structures described in this embodiment can be combined as appropriate with any of the methods and structures described in the other embodiments.

This application is based on Japanese Patent Application serial no. 2011-282453 filed with Japan Patent Office on Dec. 23, 2011, the entire contents of which are hereby incorporated by reference.

What is claimed is:
1. A semiconductor element comprising:
an oxide semiconductor layer comprising:
a first low-resistance region;
a second low-resistance region; and
a channel formation region between the first low-resistance region and the second low-resistance region, wherein the channel formation region comprises a first side surface and a second side surface opposite to the first side surface;
a first insulating film over the oxide semiconductor layer;
a gate electrode facing a top surface, the first side surface, and the second side surface of the channel formation region with the first insulating film interposed therebetween;
a second insulating film over the gate electrode;
a first electrode over the second insulating film; and
a second electrode over the second insulating film,
wherein the first low-resistance region and the second low-resistance region each have a resistance lower than the channel formation region, and
wherein the first electrode is in contact with the first low-resistance region through a first opening in the first insulating film and the second insulating film, and
wherein the second electrode is in contact with the second low-resistance region through a second opening in the first insulating film and the second insulating film.

2. The semiconductor element according to claim 1,
wherein a side surface of the first electrode is in contact with the first low-resistance region, and
wherein a side surface of the second electrode is in contact with the second low-resistance region.

3. The semiconductor element according to claim 1,
wherein a bottom surface of the first electrode is provided in the first low-resistance region, and
wherein a bottom surface of the second electrode is provided in the second low-resistance region.

4. The semiconductor element according to claim 1, wherein the oxide semiconductor layer comprises indium and zinc.

5. The semiconductor element according to claim 1, wherein a width of the channel formation region in a channel width direction is longer than or equal to 1 nm to shorter than or equal to 60 nm.

6. A semiconductor element comprising:
a first electrode;
a second electrode;
an oxide semiconductor layer between the first electrode and the second electrode, wherein the oxide semiconductor layer has a first side surface and a second side surface opposite to the first side surface;
a first insulating film over the first electrode, the second electrode, and the oxide semiconductor layer;
a gate electrode facing a top surface, the first side surface, and the second side surface of the oxide semiconductor layer with the first insulating film interposed therebetween;
a second insulating film over the gate electrode;
a first wiring over the second insulating film; and
a second wiring over the second insulating film,
wherein a side surface of the first electrode and a side surface of the second electrode is in contact with the oxide semiconductor layer,
wherein the first wiring is in contact with the first electrode through a first opening in the first insulating film and the second insulating film, and
wherein the second wiring is in contact with the second electrode through a second opening in the first insulating film and the second insulating film.

7. The semiconductor element according to claim 6, wherein the oxide semiconductor layer comprises indium and zinc.

8. The semiconductor element according to claim 6, wherein a width of the oxide semiconductor layer in a channel width direction is longer than or equal to 1 nm to shorter than or equal to 60 nm.

9. A semiconductor element comprising:
an oxide semiconductor layer;
a first insulating film over the oxide semiconductor layer;
a gate electrode facing part of a top surface of the oxide semiconductor layer, part of a first side surface of the oxide semiconductor layer, and part of a second side surface of the oxide semiconductor layer with the first insulating film interposed therebetween, wherein the first side surface is opposite to the second side surface;
a second insulating film over the gate electrode;
a first electrode over the second insulating film; and
a second electrode over the second insulating film,
wherein the first electrode is in contact with the oxide semiconductor layer through a first opening in the first insulating film and the second insulating film, and
wherein the second electrode is in contact with the oxide semiconductor layer through a second opening in the first insulating film and the second insulating film.

* * * * *